US012652047B2

(12) United States Patent
Shigesawa et al.

(10) Patent No.: US 12,652,047 B2
(45) Date of Patent: Jun. 9, 2026

(54) SEMICONDUCTOR DEVICE

(71) Applicants: KABUSHIKI KAISHA TOSHIBA, Tokyo (JP); Toshiba Electronic Devices & Storage Corporation, Tokyo (JP)

(72) Inventors: Eriko Shigesawa, Tokyo (JP); Akio Ogura, Yokohama Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 1 day.

(21) Appl. No.: 18/596,066

(22) Filed: Mar. 5, 2024

(65) Prior Publication Data

US 2025/0105844 A1 Mar. 27, 2025

(30) Foreign Application Priority Data

Sep. 22, 2023 (JP) ................................. 2023-158488

(51) Int. Cl.
| | |
|---|---|
| *H03K 17/00* | (2006.01) |
| *H03K 17/16* | (2006.01) |
| *H03K 17/30* | (2006.01) |
| *H03K 19/00* | (2006.01) |
| *H03K 19/017* | (2006.01) |

(52) U.S. Cl.
CPC ..... *H03K 19/01742* (2013.01); *H03K 17/162* (2013.01); *H03K 17/302* (2013.01); *H03K 19/0013* (2013.01)

(58) Field of Classification Search
CPC ......... H03K 19/01742; H03K 19/0013; H03K 19/00361; H03K 17/162; H03K 17/302
See application file for complete search history.

(56) References Cited

U.S. PATENT DOCUMENTS

| | | | |
|---|---|---|---|
| 5,216,292 A | 6/1993 | Imazu et al. | |
| 5,218,424 A | 6/1993 | Sommargren | |
| 5,459,437 A * | 10/1995 | Campbell ............ | H03K 3/3565 331/25 |
| 5,642,063 A | 6/1997 | Lehikoinen | |

(Continued)

FOREIGN PATENT DOCUMENTS

| | | |
|---|---|---|
| JP | H04-229719 | 8/1992 |
| JP | H08-130446 | 5/1996 |

(Continued)

*Primary Examiner* — Tuan T Lam
(74) *Attorney, Agent, or Firm* — Knobbe, Martens, Olson & Bear, LLP

(57) ABSTRACT

According to one embodiment, a semiconductor device includes a first terminal which is coupled to a first node and to which a control signal is externally input, a first circuit coupled to the first node, configured to switch based on a logic level of the first node between a first state where a first voltage is not output to a second node and a second state where the first voltage is output to the second node, and configured to control a slew rate of an output voltage at a time of switching from the first state to the second state, and a second circuit including a switch circuit which includes one end coupled to the first node and another end applied with a second voltage, and configured to control the switch circuit based on a voltage at the second node.

13 Claims, 17 Drawing Sheets

(56) References Cited

U.S. PATENT DOCUMENTS

| 2003/0025527 | A1* | 2/2003 | Porter | H03K 19/01721 |
| | | | | 326/82 |
| 2004/0041612 | A1* | 3/2004 | Huber | G11C 7/1051 |
| | | | | 327/323 |
| 2005/0212579 | A1* | 9/2005 | Hashimoto | H03K 3/0377 |
| | | | | 327/205 |
| 2006/0071695 | A1* | 4/2006 | Lee | H03K 17/167 |
| | | | | 327/112 |
| 2017/0093378 | A1* | 3/2017 | Sugiura | H03K 3/3565 |
| 2022/0166428 | A1* | 5/2022 | Shigesawa | H03K 17/145 |
| 2023/0291396 | A1* | 9/2023 | Chisaka | H03K 17/08104 |

FOREIGN PATENT DOCUMENTS

| JP | 2583684 | 2/1997 |
| JP | 2011-188257 | 9/2011 |

* cited by examiner

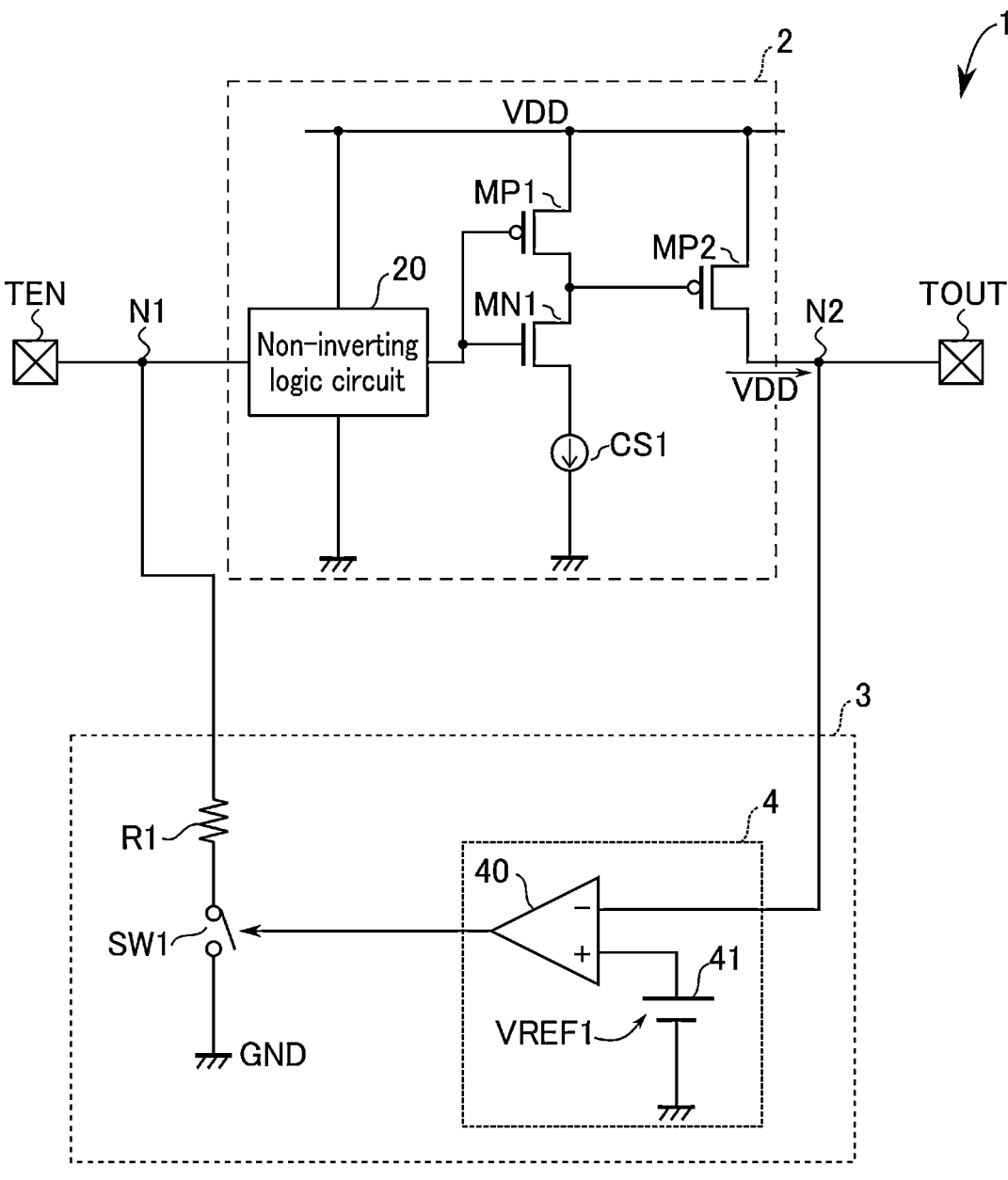
F I G. 2

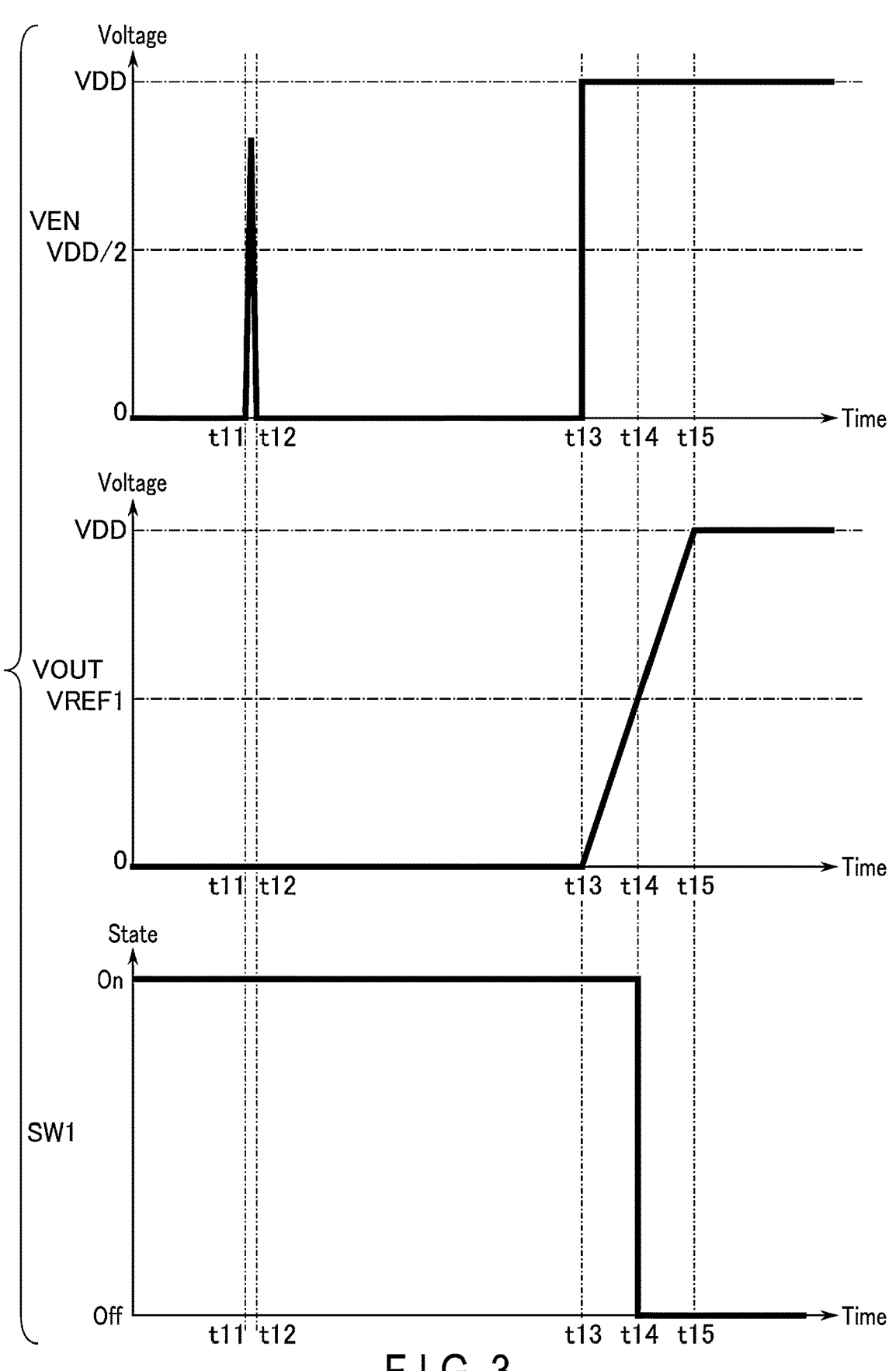
F I G. 3

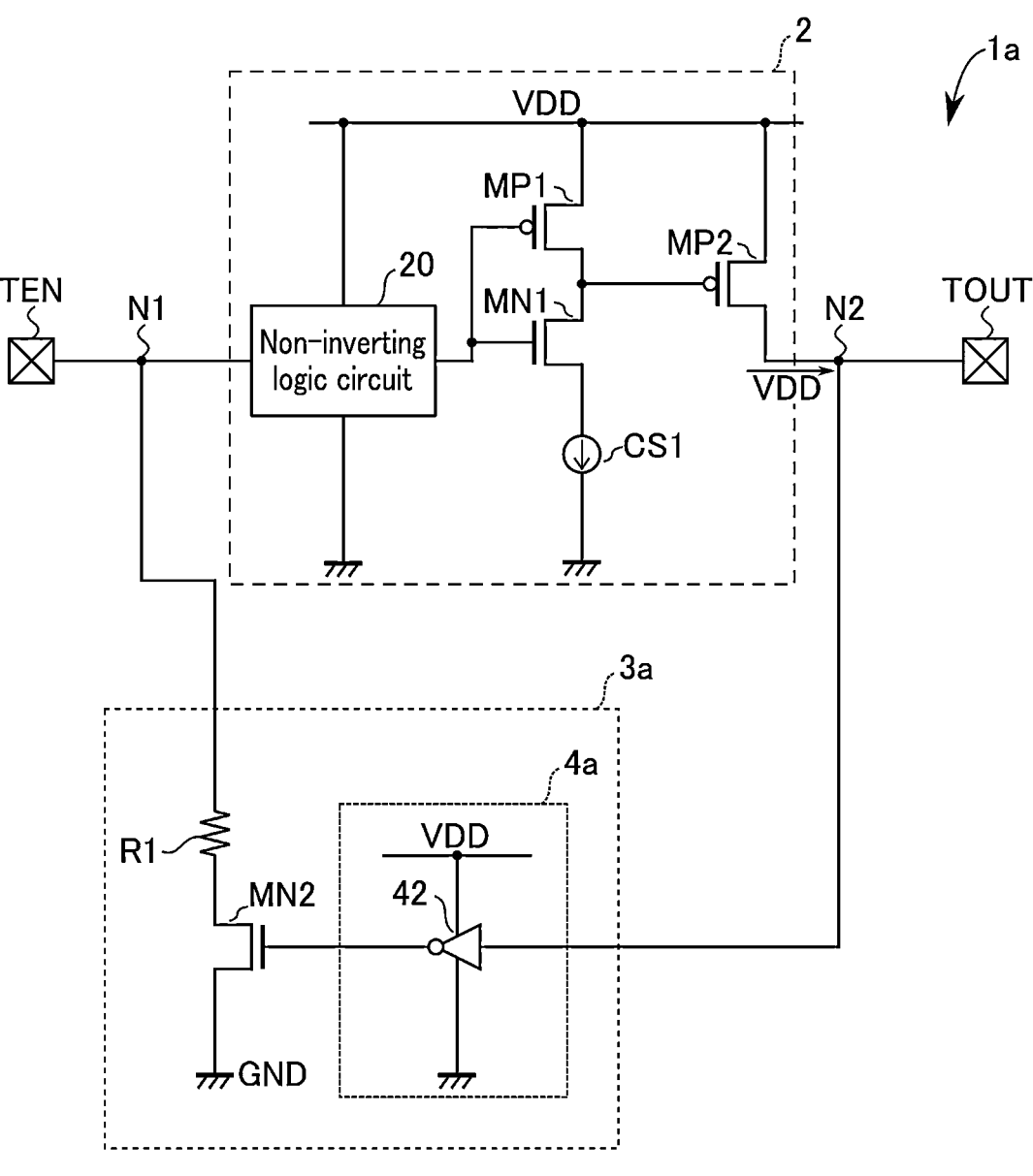
F I G. 4

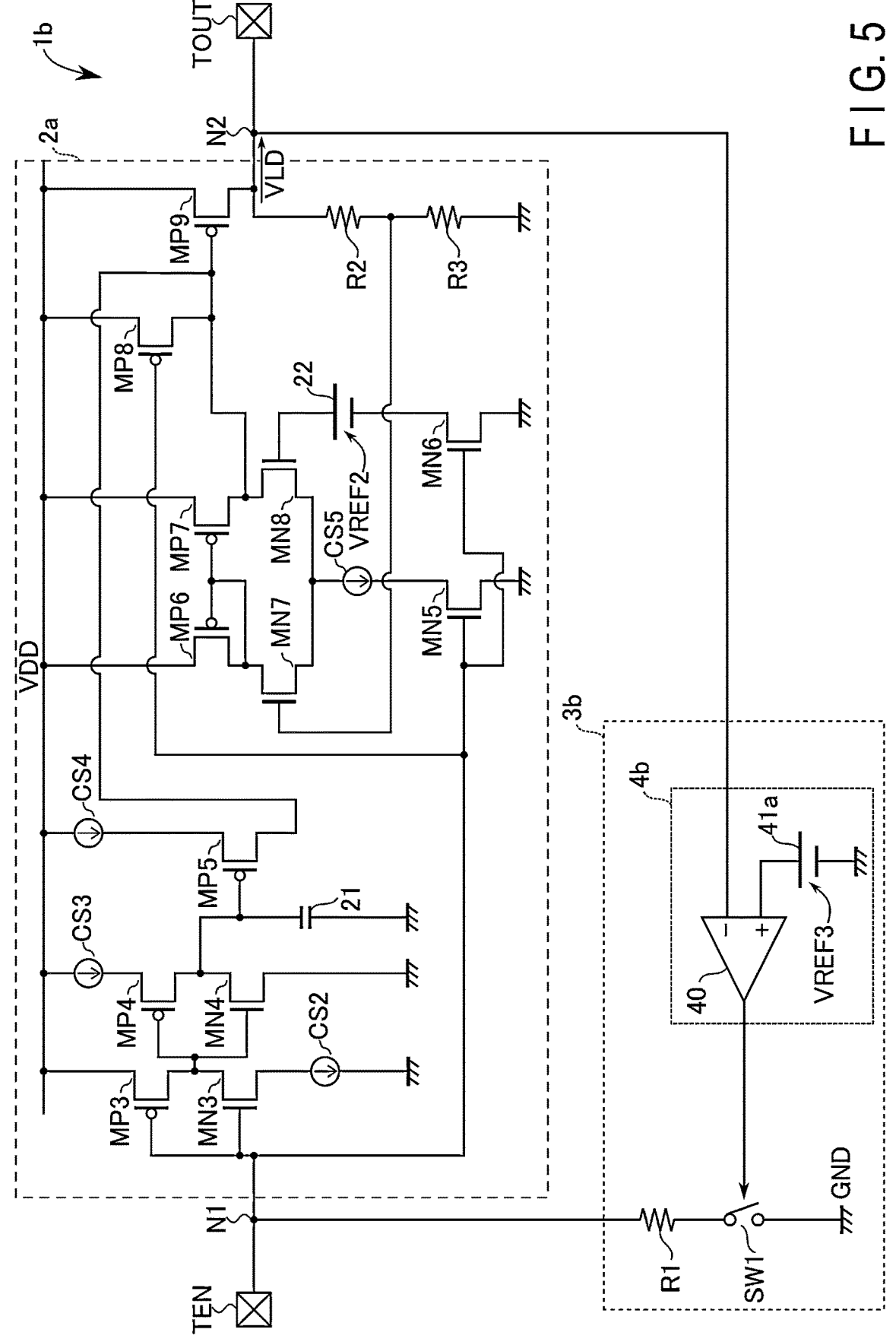
F I G . 5

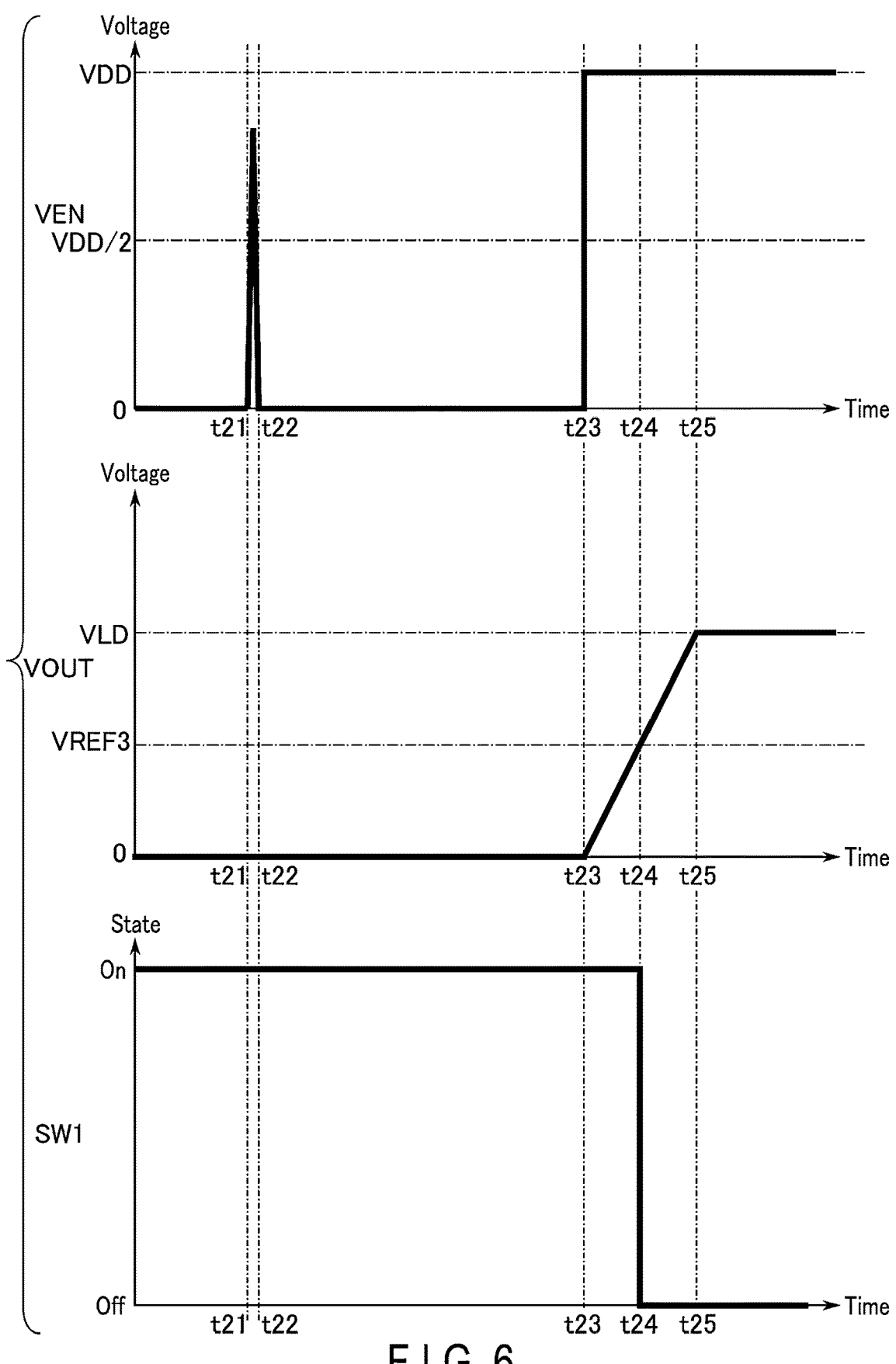
F I G. 6

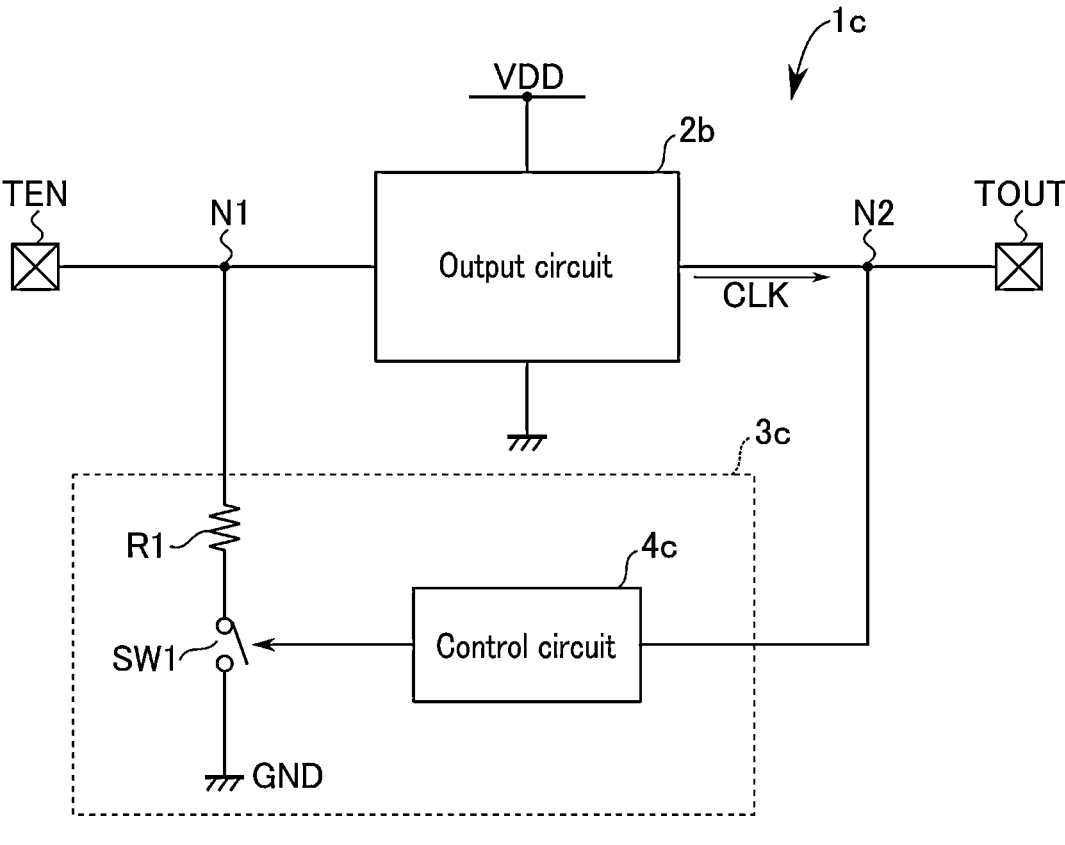
F I G. 7

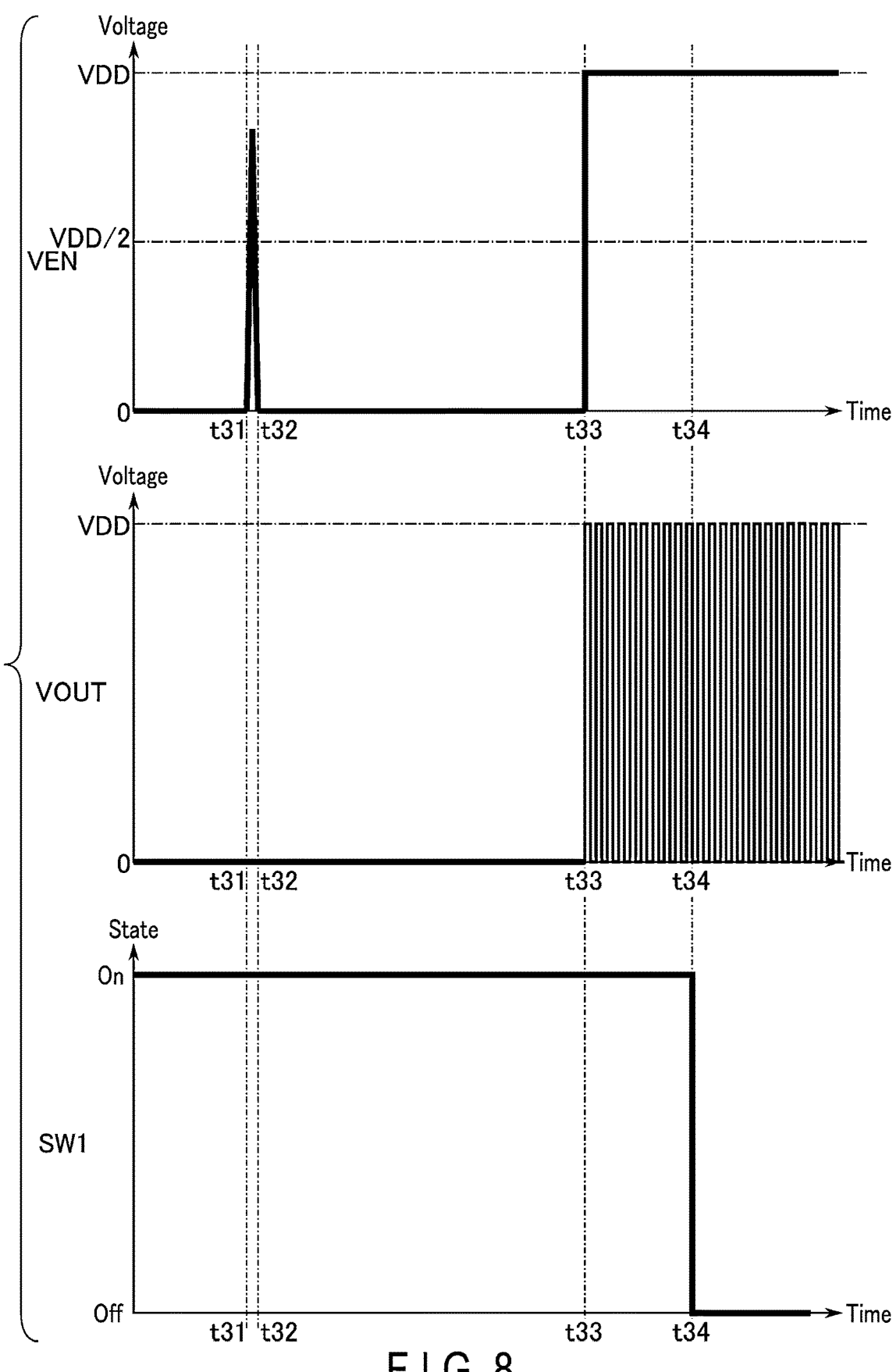
F I G. 8

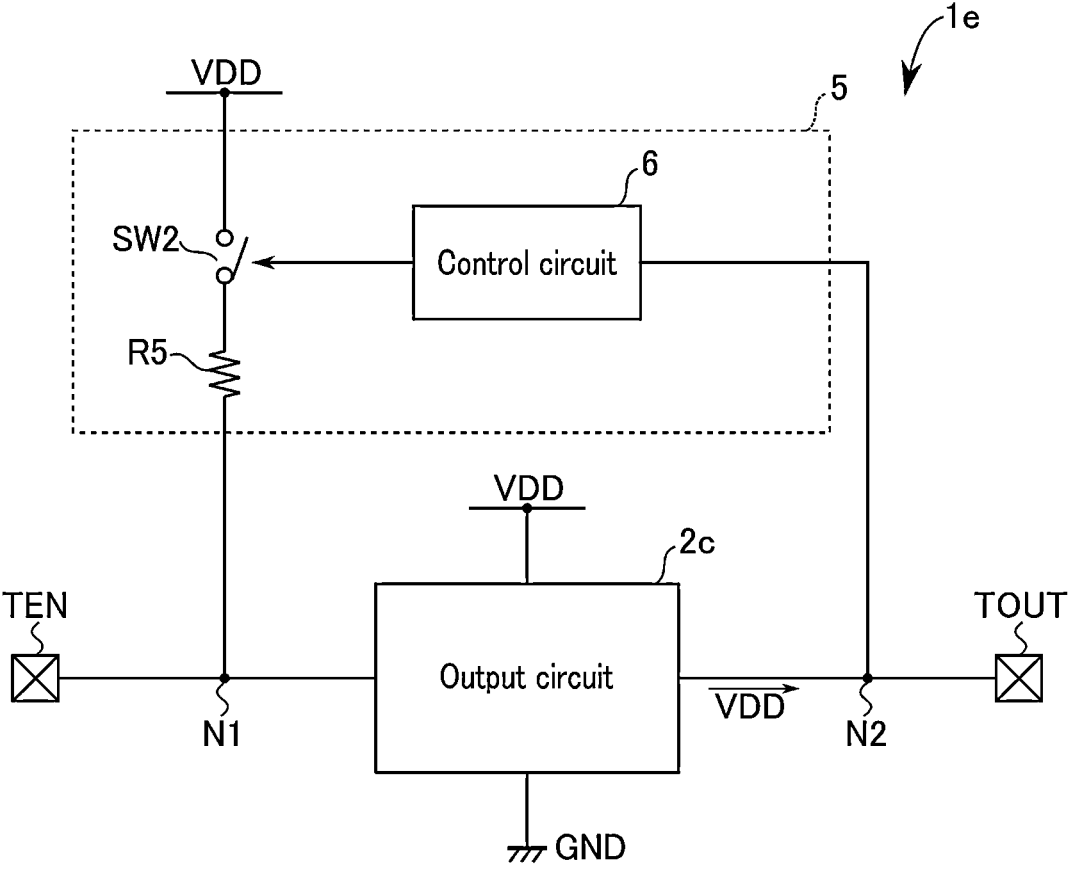
F I G. 10

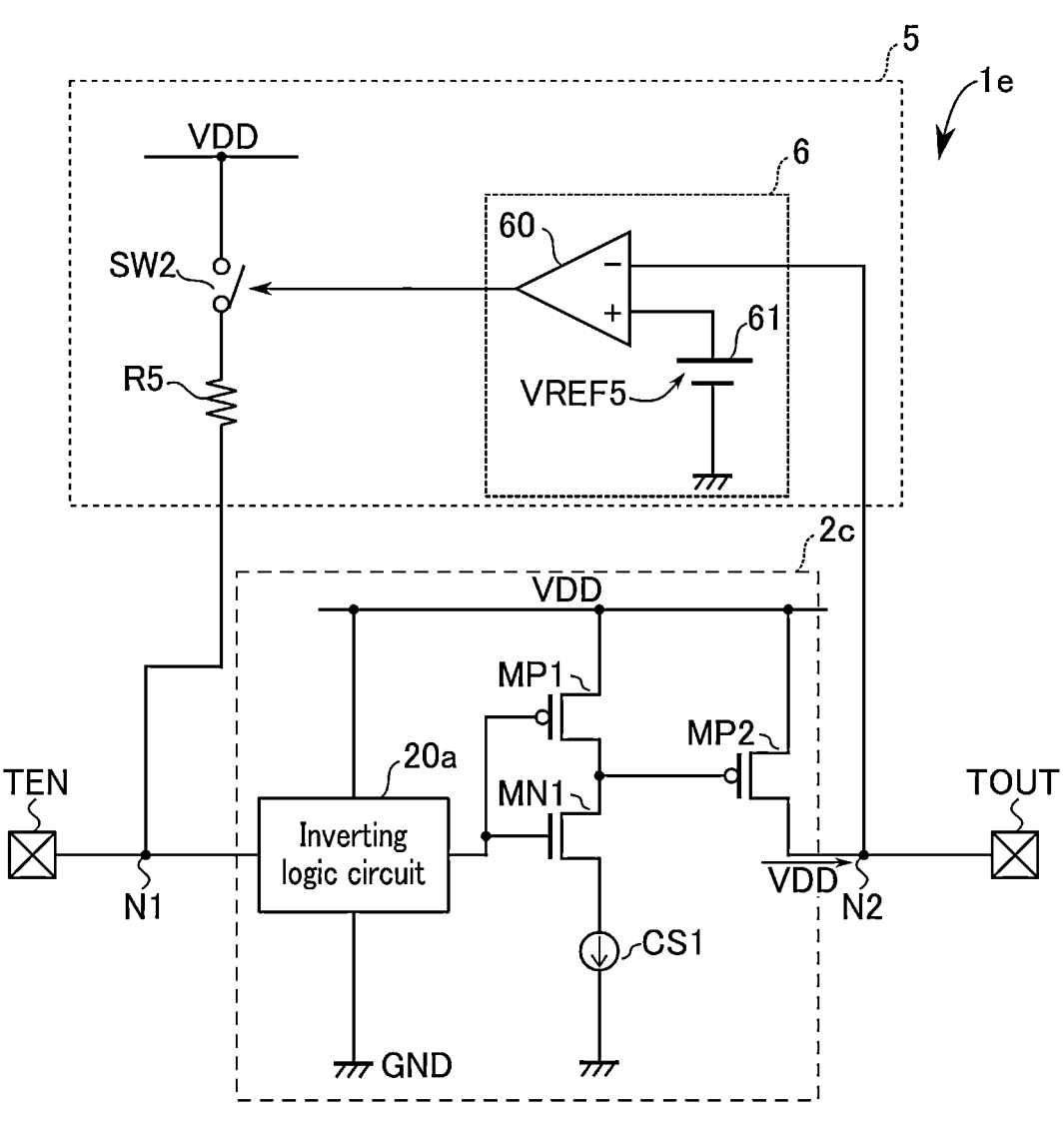
F I G. 11

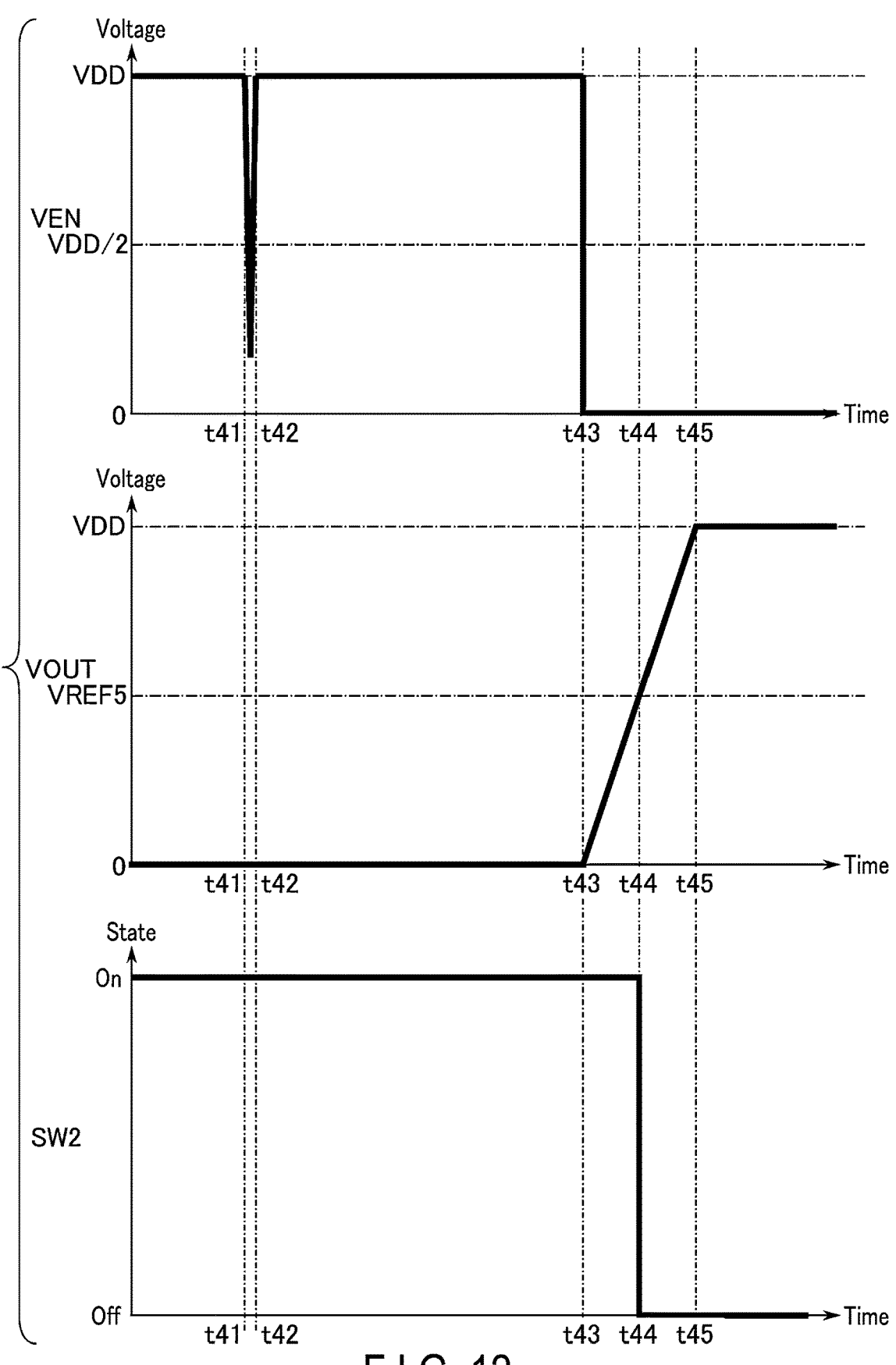
F I G. 12

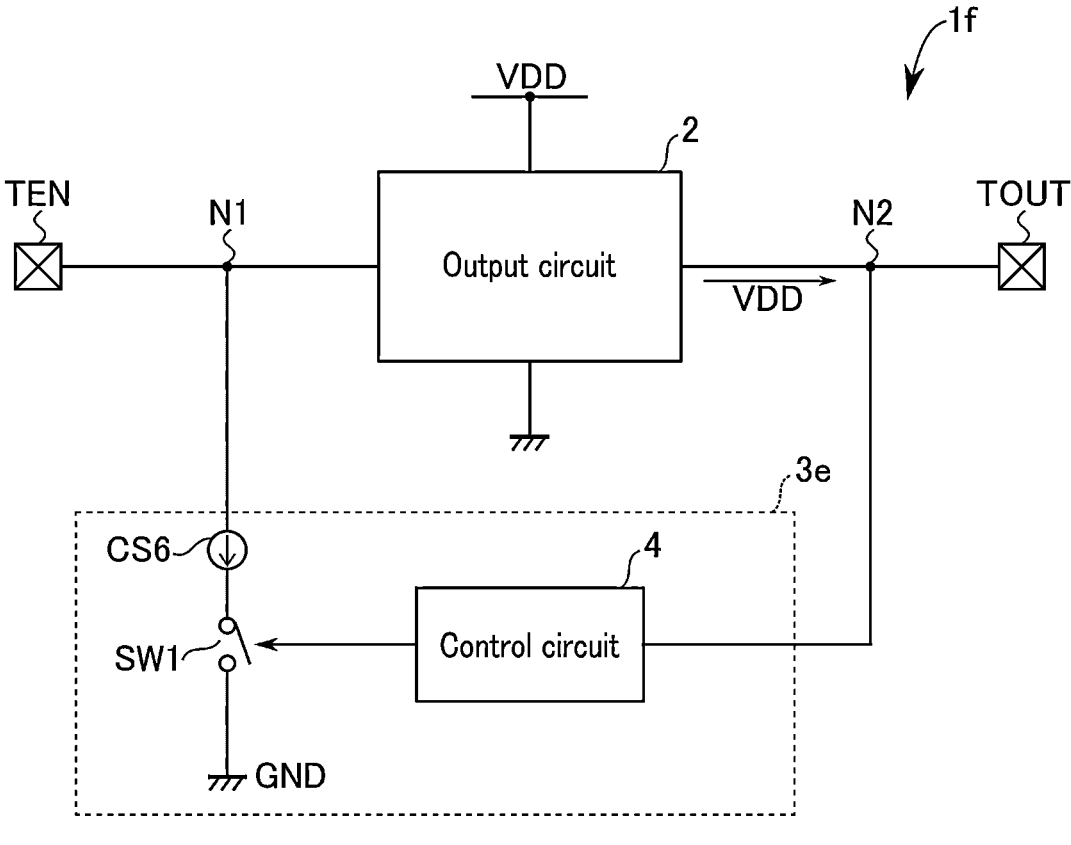
F I G. 13

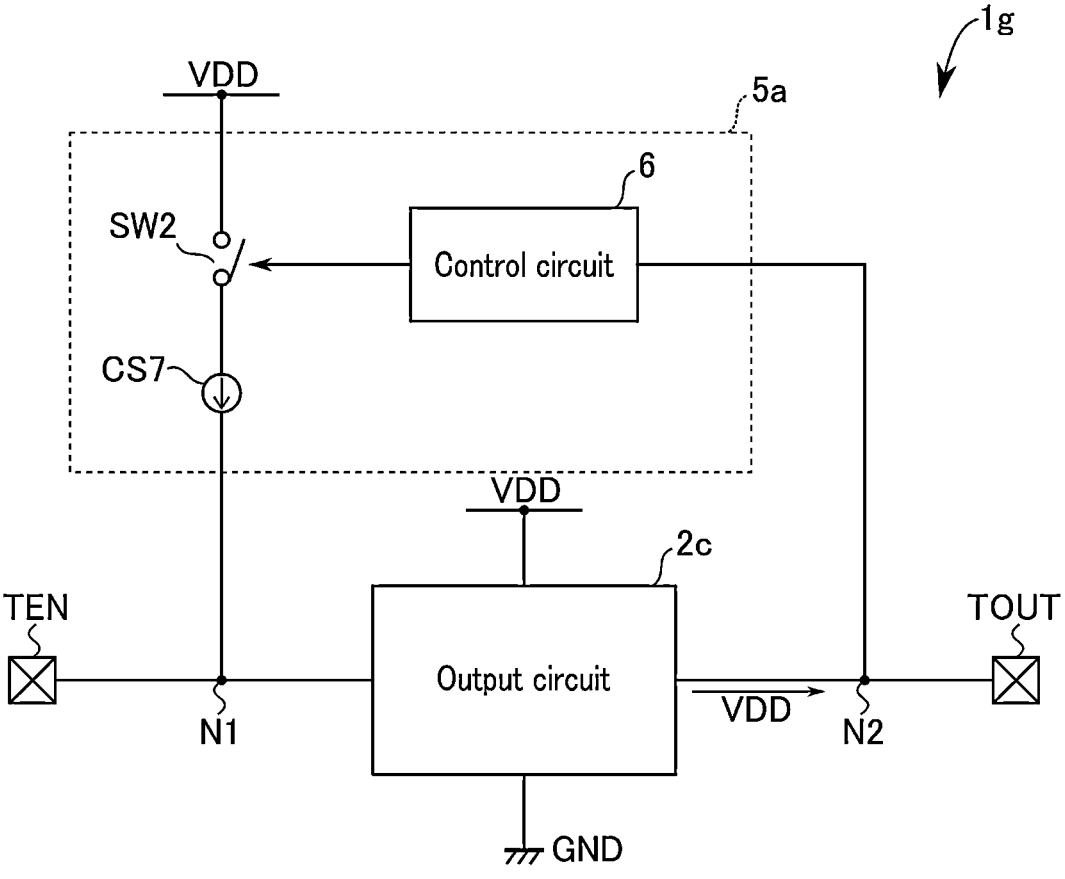
F I G. 14

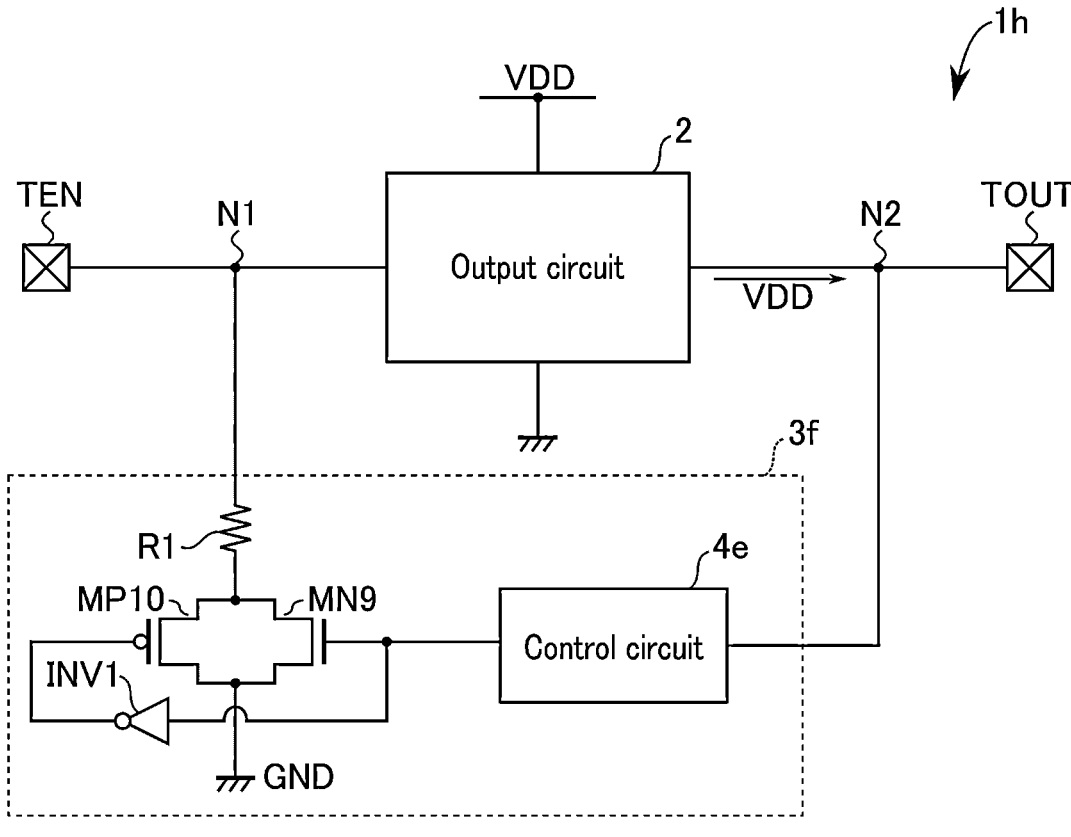
F I G. 15

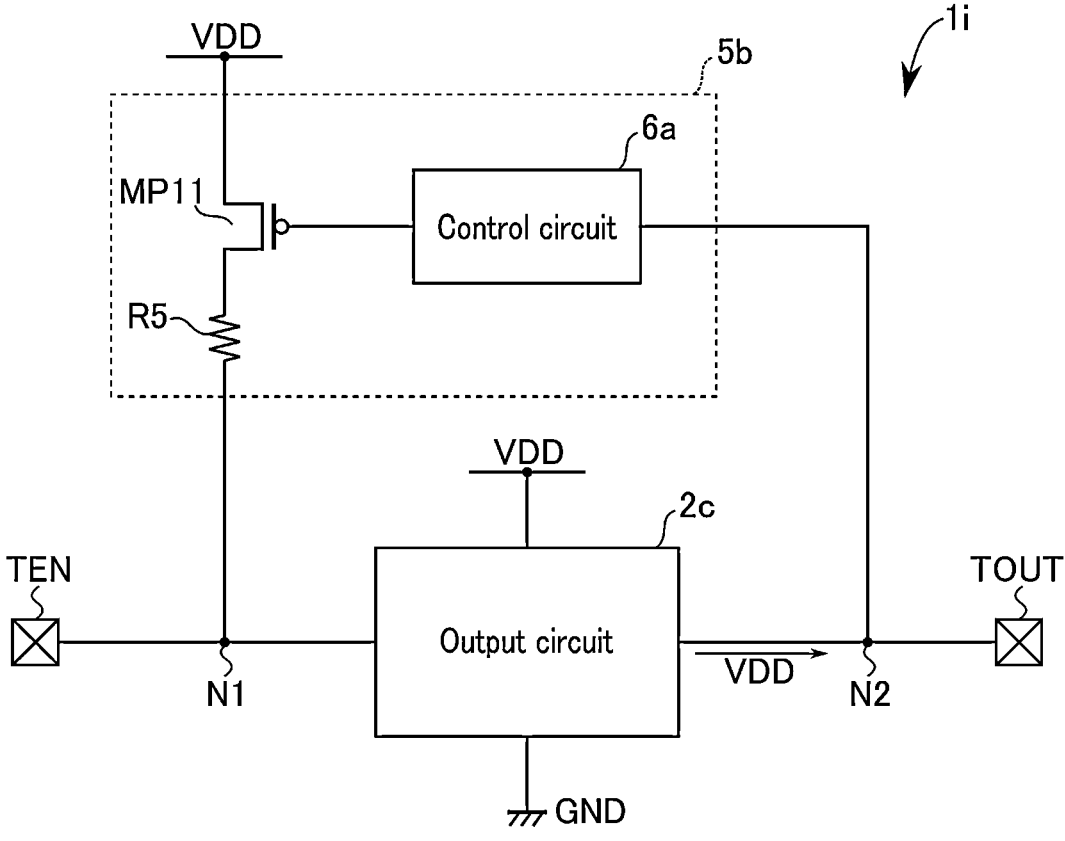
F I G. 16

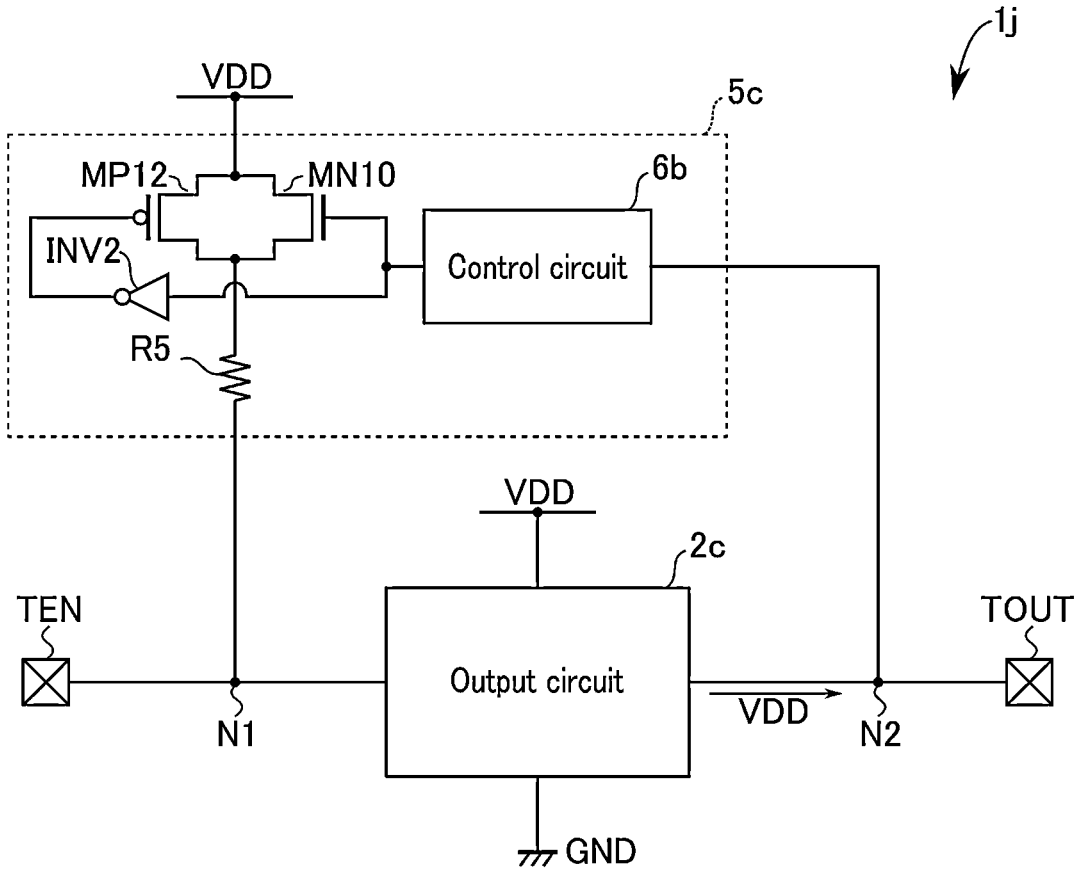
F I G. 17

SEMICONDUCTOR DEVICE

CROSS-REFERENCE TO RELATED APPLICATIONS

This application is based upon and claims the benefit of priority from Japanese Patent Application No. 2023-158488, filed Sep. 22, 2023, the entire contents of which are incorporated herein by reference.

FIELD

Embodiments described herein relate generally to a semiconductor device.

BACKGROUND

A pull-down circuit that fixes the voltage of a node is known as a semiconductor device.

BRIEF DESCRIPTION OF THE DRAWINGS

FIG. 2 is a block diagram showing a specific example of the configuration of an output circuit and a control circuit according to the first embodiment.

FIG. 3 is a timing chart showing an operation example of the semiconductor device of the first embodiment.

FIG. 4 is a block diagram showing a specific example of the configuration of an output circuit and a pull-down circuit according to a first modification of the first embodiment.

FIG. 5 is a circuit diagram showing an example of the configuration of a semiconductor device according to a second embodiment.

FIG. 6 is a timing chart showing an operation example of the semiconductor device of the second embodiment.

FIG. 7 is a block diagram showing an example of the configuration of a semiconductor device according to a third embodiment.

FIG. 8 is a timing chart showing an operation example of the semiconductor device of the third embodiment.

FIG. 10 is a block diagram showing an example of the configuration of a semiconductor device according to a fourth embodiment.

FIG. 11 is a block diagram showing a specific example of the configuration of an output circuit and a control circuit according to the fourth embodiment.

FIG. 12 is a timing chart showing an operation example of the semiconductor device of the fourth embodiment.

FIG. 13 is a block diagram showing an example of the configuration of a semiconductor device according to a second modification of the first embodiment.

FIG. 14 is a block diagram showing an example of the configuration of a semiconductor device according to a first modification of the fourth embodiment.

FIG. 15 is a block diagram showing an example of the configuration of a semiconductor device according to a third modification of the first embodiment.

FIG. 16 is a block diagram showing an example of the configuration of a semiconductor device according to a second modification of the fourth embodiment.

FIG. 17 is a block diagram showing an example of the configuration of a semiconductor device according to a third modification of the fourth embodiment.

DETAILED DESCRIPTION

Figure 1:
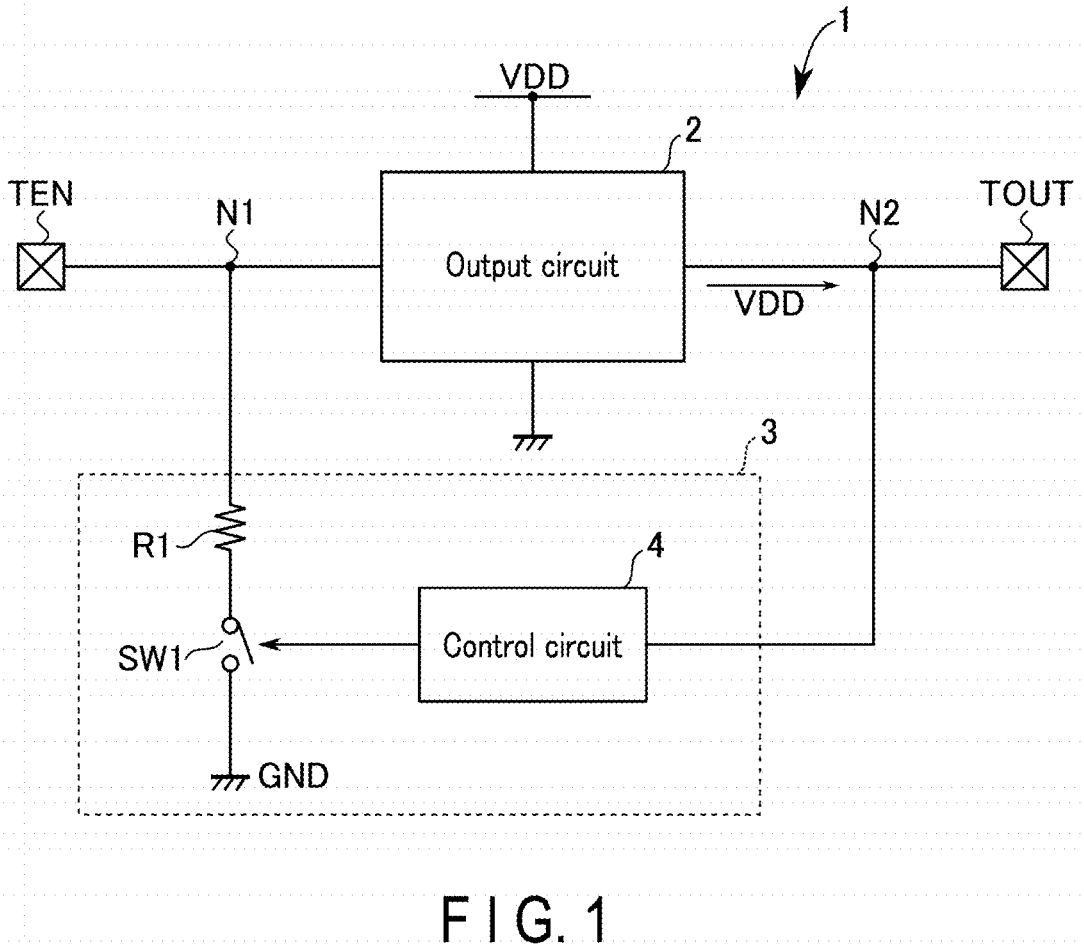
FIG. 1 is a block diagram showing an example of the configuration of a semiconductor device according to a first embodiment.

In general, according to one embodiment, a semiconductor device includes a first terminal which is coupled to a first node and to which a control signal is externally input, a first circuit coupled to the first node, configured to switch based on a logic level of the first node between a first state where a first voltage is not output to a second node and a second state where the first voltage is output to the second node, and configured to control a slew rate of an output voltage at a time of switching from the first state to the second state, and a second circuit including a switch circuit which includes one end coupled to the first node and another end applied with a second voltage, and configured to control the switch circuit based on a voltage at the second node.

The embodiments will be explained below by referring to the drawings. In the explanation, structural components having basically the same functions and structures will be referred to by the same reference symbols. The embodiments are described to give examples of apparatuses and methods that realize the technical concepts of the embodiments, and the technical concepts of the embodiments are not to restrict the materials, geometries, structures, arrangements or the like of the structural components to the ones described below. Various modifications may be made to the embodiments.

<1> First Embodiment

A semiconductor device according to the first embodiment will be described.

<1-1> Configuration

FIG. 1 is a block diagram showing an example of the configuration of the semiconductor device of the first embodiment. The semiconductor device 1 of the first embodiment is a load switch that has a slew rate control function and supplies power to a load. The semiconductor device 1 is an integrated circuit (IC) chip that switches between valid and invalid outputs, based on an externally supplied control signal.

The semiconductor device 1 includes terminals TEN and TOUT, an output circuit 2, and a pull-down circuit 3. The terminal TEN is a control signal input terminal of the semiconductor device 1. The terminal TEN is configured such that it can be coupled to an external device of the semiconductor device 1. The terminal TEN is coupled to a node N1. A control signal is supplied to the terminal TEN from a preceding stage circuit (not shown) provided externally of the semiconductor device 1. The terminal TOUT is an output terminal of the semiconductor device 1. The terminal TOUT is configured such that it can be coupled to an external device of the semiconductor device 1. Power is supplied to the external device of the semiconductor device 1 from the terminal TOUT. The terminal TOUT is coupled to a node N2.

The output circuit 2 is a circuit that enables the semiconductor device 1 to function as a load switch. A voltage VDD, which is a power supply voltage, and a ground voltage GND are applied to the output circuit 2. That is, the output circuit 2 is coupled to a power supply voltage line which is applied with the voltage VDD and a ground voltage line which is applied with the ground voltage GND. The output circuit 2 is coupled to the nodes N1 and N2. In accordance with the logic level of the node N1, the output circuit 2 switches between an on state (second state) in which the voltage VDD is output to the node N2 and an off state (first state) in which the voltage VDD is not output to the node N2. Specifically, the output circuit 2 is turned off when the logic level of the node N1 is an L (Low) level, and is turned on when the logic level of the node N1 is an H (High) level. The output circuit 2 has a slew rate control function. That is, when the off state is switched to the on state, the output circuit 2 controls the voltage increase rate at which the output voltage is switched from 0V (the state where no voltage is output) to the voltage VDD. More specifically, the output circuit 2 is configured such that 30 μsec or a longer time is required from 0V to ½ of the final voltage, that is, from 0V to ½ of the voltage VDD.

The pull-down circuit 3 pulls down the node N1. Specifically, based on the voltage at the node N2, the pull-down circuit 3 switches between an on state in which the node N1 is pulled down and an off state in which the node N1 is not pulled down. In the description below, the case where the pull-down circuit 3 is in the on state will be referred to as a state where the pull-down circuit 3 is coupled to the node N1. Further, the case where the pull-down circuit 3 is in the off state will be referred to as a state in which the pull-down circuit 3 is decoupled from the node N1. The pull-down circuit 3 includes a resistor R1, a switch SW1, and a control circuit 4. The resistor R1 and the switch SW1 are coupled in series. In the example shown in FIG. 1, one end of the resistor R1 is coupled to the node N1, the other end of the resistor R1 is coupled to one end of the switch SW1, and the other end of the switch SW1 is grounded. In other words, one end of the switch SW1 is coupled to the node N1 via the resistor R1, and the ground voltage GND is applied to the other end of the switch SW1. The control circuit 4 controls the switch SW1, based on the voltage at the node N2. Specifically, in a case where the output circuit 2 is detected as outputting a voltage equal to or higher than a preset threshold to the node N2, the control circuit 4 turns off the switch SW1. In a case where the output circuit 2 is detected as not outputting a voltage equal to or higher than the threshold value to the node N2, the control circuit 4 turns on the switch SW1. That is, the pull-down circuit 3 is decoupled from the node N1 when a voltage equal to or higher than the threshold value is applied to the node N2, and is coupled to the node N1 when a voltage equal to or higher than the threshold value is not applied to the node N2.

FIG. 2 is a block diagram showing a specific example of the configuration of the output circuit 2 and the control circuit 4 according to the first embodiment. As shown in FIG. 2, the output circuit 2 of the first embodiment includes a non-inverting logic circuit 20, transistors MN1, MP1 and MP2, and a current source CS1. The transistor MN1 is an N-channel metal oxide semiconductor field effect transistor (MOSFET). The transistors MP1 and MP2 are P-channel MOSFETs.

The voltage VDD and the ground voltage GND are applied to the non-inverting logic circuit 20. A signal input terminal of the non-inverting logic circuit 20 is coupled to the node N1, and a signal output terminal is coupled to the gates of the transistors MP1 and MN1. The non-inverting logic circuit 20 applies a voltage based on the logic level of the node N1 to the gates of the transistors MP1 and MN1. For example, in a case where an H level voltage is applied to the node N1, the non-inverting logic circuit 20 outputs an H level voltage. In this case, the transistor MP1 is turned off and the transistor MN1 is turned on. For example, in a case where an L-level voltage is applied to the node N1, the non-inverting logic circuit 20 outputs an L-level voltage. In this case, the transistor MP1 is turned on and transistor MN1 is turned off.

The voltage VDD is applied to the source of the transistor MP1. The drain of the transistor MP1 and the drain of the transistor MN1 are coupled to the gate of the transistor MP2. For example, in a case where the non-inverting logic circuit 20 outputs an L-level voltage, the transistor MP1 is turned on and the transistor MN1 is turned off. Therefore, the transistor MP2 is turned off. Further, in a case where the non-inverting logic circuit 20 outputs an H level voltage, the transistor MP1 is turned off and the transistor MN1 is turned on. Therefore, the transistor MP2 is turned on.

The current source CS1 is coupled to the source of the transistor MN1. The current source CS1 is configured to flow a current from the source of the transistor MN1 toward the ground voltage line applied with the ground voltage GND.

The voltage VDD is applied to the source of the transistor MP2. The drain of the transistor MP2 is coupled to the node N2. The transistor MP2 applies the voltage VDD to the node N2 in an on state, and does not apply the voltage VDD to the node N2 in an off state. The transistors MP1 and MN1 and the current source CS1 jointly function as a gate driver that drives the gate of the transistor MP2. In this gate driver, the amount of current for driving the gate of the transistor MP2 from the H level to the L level is controlled by the current source CS1. Therefore, the output circuit 2 controls the length of time required for the transistor MP2 to switch from the off state to the on state. That is, the output circuit 2 of the first embodiment controls the slew rate of the output voltage for switching from the off state to the on state.

With reference to FIG. 2, a further description will be given of the configuration of the control circuit 4 included in the pull-down circuit 3. As shown in FIG. 2, the control circuit 4 of the first embodiment includes a comparator 40 and a voltage source 41. The voltage source 41 outputs a voltage VREF1. The voltage VREF1 is higher than the ground voltage GND and lower than the voltage VDD. The voltage VREF1 is, for example, ½ of the voltage VDD. The positive output terminal of the voltage source 41 is coupled to the non-inverting input terminal of the comparator 40. The negative output terminal of the voltage source 41 is grounded.

The inverting input terminal of the comparator 40 is coupled to the node N2. The output terminal of the comparator 40 is coupled to the switch SW1. The switch SW1 is controlled based on the output of the comparator 40. More specifically, in a case where the output of the comparator 40 is at the H level, the switch SW1 is turned on. In a case where the output of the comparator 40 is at the L level, the switch SW1 is turned off.

<1-2> Operation

A description will be given of the operation performed by the semiconductor device 1 of the first embodiment. The voltage at the terminal TEN will be referred to as a voltage VEN. The voltage at the terminal TOUT will be referred to as a VOUT.

FIG. 3 is a timing chart showing an operation example of the semiconductor device 1 of the first embodiment. FIG. 3 shows how the semiconductor device 1 operates when noise is applied to the terminal TEN, and how the semiconductor device 1 switches when an H level signal is applied to the terminal TEN. In FIG. 3, the states of the voltage VEN, the voltage VOUT and the switch SW1 are shown in order from the top.

In FIG. 3, the timing chart starts when a high impedance state is established from a state where the preceding stage device applies an L level to the terminal TEN. In this state, the voltage VEN is 0V, the voltage VOUT is 0V, and the switch SW1 is in the on state. Since the switch SW1 is in the on state, the node N1 is pulled down to 0V by the pull-down circuit 3. Since the voltage at the node N1 is 0V, that is, the L level, the output circuit 2 is in an off state, and the voltage VOUT is 0V.

At time t11, noise is applied to the terminal TEN, and the voltage VEN rises rapidly. For example, the peak of the voltage VEN exceeds ½ of the voltage VDD. Thereafter, the voltage VEN decreases, and becomes 0V at time t12. The period from time t11 to time t12 is, for example, several μsec. The period from time t11 to time t12 is shorter than the time required for the output of the output circuit 2 to switch from 0V to the voltage VDD. Therefore, the output circuit 2 maintains output of 0V. Since the voltage VOUT is maintained at 0V, the switch SW1 also maintains an on state during the period from time t11 to time t12.

At time t13, the preceding stage device coupled to the terminal TEN outputs the voltage VDD as an H level signal, and the voltage VEN becomes equal to the voltage VDD. After time t13, the voltage VEN is maintained at the voltage VDD. Since the voltage VEN has become higher than ½ of the voltage VDD, the output circuit 2 starts the operation of outputting the voltage VDD at time t13. During the period from time t13 to time t15, the voltage VOUT rises from 0V to the voltage VDD, with the slew rate being controlled by the output circuit 2. It should be noted that at time t13, the voltage VOUT is lower than the voltage VREF1, so that the switch SW1 maintains the on state.

At time t14, the voltage VOUT becomes higher than the voltage VREF1, and the switch SW1 changes from the on state to the off state. After time t14, the switch SW1 maintains the off state. Since the switch SW1 is turned off, the power consumed by the pull-down circuit 3 decreases. Specifically, the power consumed by the resistor R1 is no longer consumed. It should be noted that the period from time t13 to time t14 is the time required for the voltage VOUT to rise from 0V to ½ of the voltage VDD, which is the final voltage, and is therefore 30 μsec or longer.

At time t15, the voltage VOUT reaches the voltage VDD, and the voltage VOUT stops rising. After time t15, the voltage VOUT is maintained at the voltage VDD.

<1-3> Advantages

The semiconductor device 1 of the first embodiment described above is advantageous in that power consumption can be suppressed while simultaneously suppressing malfunctions due to noise. Detailed advantages of the semiconductor device 1 of the first embodiment will be described below.

The pull-down circuit stabilizes the voltage at a node coupled to the pull-down circuit, and suppresses disturbances of the logic level of that node due to noise. However, if an H level signal is applied to the node coupled to the pull-down circuit, a current flows through the pull-down circuit, and power is consumed. While the node to which the pull-down circuit is coupled continues to be driven to the H level, the pull-down circuit should preferably be decoupled from the node to suppress power consumption.

It should be noted that the voltage at the node coupled to the pull-down circuit may rise instantaneously due to noise, or may rise to the H level while being driven by the preceding stage circuit. If the pull-down circuit is decoupled when the voltage at the node instantaneously rises due to noise, the voltage at the node becomes unstable, and the circuit may malfunction. If the voltage at the node rises instantaneously due to noise, it is preferable that the pull-down circuit should be kept coupled to the node. If the voltage at the node is rises to the H level while being driven by the preceding stage circuit, it is preferable that the pull-down circuit should be decoupled from the node.

The semiconductor device 1 of the first embodiment includes a terminal TEN which is coupled to a node N1 and to which a control signal is externally input; an output circuit 2 which is coupled to the node N1, which switches based on the logic level of the node N1 between a first state in which the voltage VDD is not supplied to the node N2 and a second state in which the voltage VDD is supplied to the node N2, and which controls the slew rate of the output voltage in response to switching from the first state to the second state; and a pull-down circuit 3 which includes a switch SW1 whose one end is coupled to the node N1 and whose another end is applied with a ground potential GND, and which controls the switch SW1, based on the voltage at the node N2.

Even if the voltage at the node N1 instantaneously increases due to noise, the output circuit 2 can control the slew rate of the output voltage such that the voltage at the node N2 does not rise. Since the voltage at the node N2 does not change, the pull-down circuit 3 maintains the on state of the switch SW1 even if the voltage at the node N1 instantaneously increases due to noise. That is, the pull-down circuit 3 maintains the state in which the node N1 is pulled down.

On the other hand, in the case where the node N1 is driven to the voltage VDD by the preceding circuit, the output circuit 2 is switched to the on state and the voltage at the node N2 rises. When the voltage at the node N2 becomes higher than the voltage VREF1, the pull-down circuit 3 sets the switch SW1 to the off state. That is, the pull-down circuit 3 sets a state in which the node N1 is not pulled down.

In this manner, the semiconductor device 1 of the first embodiment maintains the coupled state of the pull-down circuit 3 in the event of an instantaneous voltage rise due to noise, and decouples the pull-down circuit 3 if the output circuit 2 operates in response to a control signal applied thereto and the output voltage exceeds the threshold value. Therefore, the semiconductor device 1 of the first embodiment enables suppression of the power consumption while simultaneously suppressing malfunctions due to noise.

Further, the semiconductor device 1 of the first embodiment decouples the pull-down circuit 3 at a time which is after the control signal is applied and when output circuit 2 starts operating and the output voltage exceeds the threshold value. That is, the pull-down circuit 3 is not decoupled until after the control signal becomes H level and the output of the output circuit 2 exceeds the threshold value. This standby time prevents the pull-down circuit 3 from being decoupled in case of an instantaneous voltage rise which may occur.

For example, it is conceivable to design a circuit which uses a low-pass filter and which decouples the pull-down circuit 3 a certain period of time after the control signal becomes H level. In this case, an area for configuring the low-pass filter is required on the chip. It is also conceivable that the standby time may vary due to variations at the time of manufacturing the elements constituting the low-pass filter. On the other hand, in the semiconductor device 1 of the first embodiment, the pull-down circuit 3 monitors the output of the output circuit 2, thereby causing a standby time. Therefore, in the semiconductor device 1 of the first embodiment, an area for forming a filter is not required, and the standby time does not vary.

Further, the semiconductor device 1 of the first embodiment does not decouple the pull-down circuit 3 until after the output circuit 2 starts operating and the output exceeds the voltage VREF1. That is, the pull-down circuit 3 is decoupled at the timing when the output of the output circuit 2 exceeds the threshold value, not at the timing before the output circuit 2 starts operating or the timing after an output of the output circuit 2 reaches the voltage VDD. In this manner, the semiconductor device 1 of the first embodiment can set a standby time in accordance with the operation timing of the circuit.

<2-4> Modification

In connection with the first embodiment, reference was made to an example in which the control circuit 4 of the pull-down circuit 3 includes the comparator 40 and the voltage source 41. The configuration of the control circuit 4 is not limited to this. For example, the control circuit 4 may be configured by an inverter. Further, the switch SW1 of the pull-down circuit 3 may be configured by a transistor. FIG. 4 is a block diagram showing a specific example of the configuration of an output circuit and a pull-down circuit according to a first modification of the first embodiment. The semiconductor device 1a according to the first modification of the first embodiment differs from the semiconductor device 1 of the first embodiment in that the switch SW1 of the pull-down circuit 3 is configured by a transistor MN2, and the control circuit 4 is configured by an inverter 42.

The pull-down circuit 3a includes a resistor R1, a transistor MN2, and a control circuit 4a. The control circuit 4a includes an inverter 42. One end of the resistor R1 is coupled to the node N1. The other end of the resistor R1 is coupled to the drain of the transistor MN2. The source of the transistor MN2 is grounded. The input terminal of the inverter 42 is coupled to the node N2. The output terminal of the inverter 42 is coupled to the gate of transistor MN2. The inverter 42 inverts the logic level of the node N2 and outputs an inverted logic level to the gate of the transistor MN2. The voltage VDD is applied to the positive power supply terminal of the inverter. The negative power supply terminal of the inverter is grounded.

The inverter 42 is used like a comparator that compares ½ of the applied power supply voltage with an input signal and outputs the magnitude relationship as an H level or an L level. The transistor MN2 is used as a switch that is turned off when an L level is applied the gate, and turned on when an H level is applied to the gate.

Even in a case where the pull-down circuit 3 is configured in this manner, advantages similar to those of the semiconductor device 1 of the first embodiment can be obtained.

<2> Second Embodiment

The configuration of the semiconductor device of the second embodiment differs from that of the semiconductor device of the first embodiment in that the output circuit 2 is replaced with an output circuit 2a, and the pull-down circuit 3 is replaced with a pull-down circuit 3b. A description will be given of the points in which the semiconductor device 1b of the second embodiment differs from the semiconductor device of the first embodiment.

<2-1> Configuration

FIG. 5 is a circuit diagram showing an example of the configuration of the semiconductor device 1b of the second embodiment. In the semiconductor device 1b of the second embodiment, the output circuit 2 of the semiconductor device 1 described in connection with the first embodiment is replaced with an output circuit 2a, and the pull-down circuit 3 is replaced with a pull-down circuit 3b.

The semiconductor device 1b of the second embodiment is a linear regulator that has a slew rate control function and that supplies power to a load. More specifically, the semiconductor device 1b of the second embodiment is a low saturation type linear regulator and is referred to as a low dropout (LDO) as well.

The output circuit 2a is a circuit that enables the semiconductor device 1b to function as a linear regulator. The voltage VDD, which is a power supply voltage, and the ground voltage GND are applied to the output circuit 2a. The output circuit 2a is coupled to nodes N1 and N2. In accordance with the logic level of the node N1, the output circuit 2a switches between an on state (second state) in which a voltage VLD is output to the node N2 and an off state (first state) in which the voltage VLD is not output to the node N2. The voltage VLD is lower than the voltage VDD and higher than the ground voltage GND. Specifically, the output circuit 2a is turned off when the logic level of the node N1 is an L level, and turned on when the logic level of the node N1 is an H level. The output circuit 2a has a slew rate control function. That is, when the off state is switched to the on state, the output circuit 2a controls the voltage increase rate at which the output voltage is switched from 0V (the state where no voltage is output) to the voltage VLD. More specifically, the output circuit 2a is configured such that 30 μsec or a longer time is required from 0V to ½ of the final voltage, that is, from 0V to ½ of the voltage VLD.

The pull-down circuit 3b pulls down the node N1. Based on the voltage at the node N2, the pull-down circuit 3b switches between the on state in which the node N1 is pulled down and the off state in which the node N1 is not pulled down. The pull-down circuit 3b includes a resistor R1, a switch SW1, and a control circuit 4b. The resistor R1 and the switch SW1 are coupled in series. In the example shown in FIG. 5, one end of the resistor R1 is coupled to the node N1, the other end of the resistor R1 is coupled to one end of the switch SW1, and the other end of the switch SW1 is grounded. In other words, one end of the switch SW1 is coupled to the node N1 via the resistor R1, and the ground voltage GND is applied to the other end of the switch SW1. The control circuit 4b controls the switch SW1, based on the voltage at the node N2. Specifically, in a case where output circuit 2a is detected as outputting a voltage equal to or higher than a preset threshold to the node N2, the control circuit 4b turns off the switch SW1. In a case where the output circuit 2a is detected as not outputting a voltage equal to or higher than the threshold value to the node N2, the control circuit 4b turns on the switch SW1.

With reference to FIG. 5, a further description will be given of a specific example of the configuration of the output circuit 2a. As shown in FIG. 5, the output circuit 2a of the second embodiment includes transistors MN3 to MN8, transistors MP3 to MP9, current sources CS2 to CS5, resistors R2 and R3, a capacitor 21, and a voltage source 22. The transistors MN3 to MN8 are N-channel MOSFETs. The transistors MP3 to MP9 are P-channel MOSFETs. The voltage source 22 outputs a voltage VREF2. The voltage VREF2 is higher than the ground voltage GND and lower than the voltage VDD.

The voltage VDD is applied to the source of the transistor MP3. The gate of the transistor MP3 is coupled to the node N1. The gate of the transistor MN3 is coupled to the node N1. The current source CS2 is coupled to the source of transistor MN3. The current source CS2 is configured to flow a current from the source of the transistor MN3 toward the ground voltage line applied with the ground voltage GND. The drain of the transistor MP3, the drain of the transistor MN3, the gate of the transistor MP4, and the gate of the transistor MN4 are coupled to each other. The current source CS3 is coupled to the source of the transistor MP4. The current source CS3 is configured to flow a current from the power supply voltage line applied with the voltage VDD toward the source of the transistor MP4. The source of the transistor MN4 is grounded. The drain of the transistor MP4, the drain of the transistor MN4, the gate of the transistor MP5, and one electrode of the capacitor 21 are coupled to each other. The other electrode of the capacitor 21 is grounded. A current source CS4 is coupled to the source of the transistor MP5. The current source CS4 is configured to flow a current from the power supply voltage line applied with the voltage VDD toward the source of the transistor MP5.

The source of the transistor MN5 is grounded. The gate of the transistor MN5 is coupled to the node N1. A current source CS5 is coupled to the drain of the transistor MN5. The source of the transistor MN6 is grounded. The gate of the transistor MN6 is coupled to the node N1. The source of the transistor MN7, the source of the transistor MN8, and the current source CS5 are coupled to each other. The current source CS5 is configured to flow a current from the source of the transistor MN7 and the source of the transistor MN8 toward the drain of the transistor MN5. The positive output terminal of the voltage source 22 is coupled to the gate of transistor MN8. The negative output terminal of the voltage source 22 is coupled to the drain of transistor MN6. The drain of the transistor MN7, the gate of the transistor MP6, the drain of the transistor MP6, and the gate of the transistor MP7 are coupled to each other. The voltage VDD is applied to the source of the transistor MP6. The voltage VDD is applied to the source of the transistor MP7. The voltage VDD is applied to the source of the transistor MP8. The gate of the transistor MP8 is coupled to the node N1. The voltage VDD is applied to the source of the transistor MP9. The drain of the transistor MP9 is coupled to the node N2. The drain of the transistor MP5, the drain of the transistor MN8, the drain of the transistor MP7, the drain of the transistor MP8, and the gate of the transistor MP9 are coupled to each other. One end of the resistor R2 is coupled to the node N2. The other end of the resistor R2, one end of resistor R3, and the gate of transistor MN7 are coupled to each other. The other end of the resistor R3 is grounded.

The output circuit 2a generates a voltage VLD from the voltage VDD by controlling the gate voltage of the transistor MP9, and outputs it to the node N2. More specifically, the transistors MN7 and MN8, the transistors MP6 and MP7, and the current source CS5 jointly constitute a differential amplifier circuit. This differential amplifier circuit controls the gate voltage of the transistor MP9 such that a value obtained by dividing the voltage at the node N2 by the resistors R2 and R3 becomes equal to the voltage VREF2 of the voltage source 22. When the voltage at the node N1 is at an H level, the transistors MN5 and MN6 are turned on, enabling the differential amplifier circuit. When the voltage at the node N1 is at an L level, the transistors MN5 and MN6 are turned off, disabling the differential amplifier circuit. The transistor MP8 is turned off and does not function when the voltage at node N1 is at the H level, and is turned on when the voltage at the node N1 is at the L level, fixing the voltage at the gate of transistor MP9 to the voltage VDD. That is, the transistor MP9 is turned off.

The transistors MN3 and MN4, the transistors MP3 to MP5, the current sources CS2 to CS4, and the capacitor 21 control the slew rate of the output voltage of the output circuit 2a. More specifically, the current sources CS2 and CS3 and the capacitor 21 control the length of time required for the gate of the transistor MP5 to switch from the L level to the H level when the node N1 switches from the L level to the H level. Thus, when the node N1 switches from the L level to the H level, the current supply from the current source CS4 and the transistor MP5 to the gate of the transistor MP9 continues for a certain time, and the change in the gate voltage of the transistor MP9 slows down. Therefore, the output circuit 2a of the second embodiment controls the slew rate of the output voltage for switching from the off state to the on state.

With reference to FIG. 5, a further description will be given of the configuration of the control circuit 4b included in the pull-down circuit 3b. As shown in FIG. 5, the control circuit 4b of the second embodiment includes a comparator 40 and a voltage source 41a. The voltage source 41a outputs a voltage VREF3. The voltage VREF3 is higher than the ground voltage GND and lower than the voltage VLD. The voltage VREF3 is, for example, ½ of the voltage VLD. The positive output terminal of the voltage source 41a is coupled to a non-inverting input terminal of the comparator 40. The negative output terminal of the voltage source 41a is grounded.

The inverting input terminal of the comparator 40 is coupled to the node N2. The output terminal of the comparator 40 is coupled to the switch SW1. The switch SW1 is controlled based on the output of the comparator 40. More specifically, in a case where the output of the comparator 40 is at the H level, the switch SW1 is turned on. In a case where the output of the comparator 40 is at the L level, the switch SW1 is turned off.

<2-2> Operation

A description will be given of the operation performed by the semiconductor device 1b of the second embodiment. FIG. 6 is a timing chart showing an operation example of the semiconductor device 1b of the second embodiment. FIG. 6 shows how the semiconductor device 1b operates when noise is applied to the terminal TEN, and how the semiconductor device 1b switches when an H level signal is applied to the terminal TEN.

In FIG. 6, the timing chart starts when a high impedance state is established from a state where the preceding stage device applies an L level to the terminal TEN. In this state, a voltage VEN is 0V, a voltage VOUT is 0V, and the switch SW1 is in the on state. Since the switch SW1 is in the on state, the node N1 is pulled down to 0V by the pull-down circuit 3b. Since the voltage at the node N1 is 0V, that is, the L level, the output circuit 2a is in an off state, and the voltage VOUT is 0V.

At time t21, noise is applied to the terminal TEN, and the voltage VEN rises rapidly. For example, the peak of the voltage VEN exceeds ½ of the voltage VDD. Thereafter, the voltage VEN decreases, and becomes 0V at time t22. The period from time t21 to time t22 is, for example, several µsec. The period from time t21 to time t22 is shorter than the time required for the output of the output circuit 2a to switch from 0V to the voltage VLD. Therefore, the output circuit 2a maintains output of 0V. Since the voltage VOUT is maintained at 0V, the switch SW1 also maintains an on state during the period from time t21 to time t22.

During the period from time t22 to time t23, there is no change in the situation, so that the voltage VEN is maintained at 0V, the voltage VOUT is maintained at 0V, and the switch SW1 is maintained in the on state.

At time t23, the preceding stage device coupled to the terminal TEN outputs the voltage VDD as an H level signal, and the voltage VEN becomes equal to the voltage VDD. After time t23, the voltage VEN is maintained at the voltage VDD. Since the voltage VEN has become higher than ½ of the voltage VDD, the output circuit 2a starts the operation of outputting the voltage VLD at time t23. During the period from time t23 to time t25, the voltage VOUT rises from 0V to the voltage VLD, with the slew rate being controlled by the output circuit 2a. It should be noted that at time t23, the voltage VOUT is lower than the voltage VREF3, so that the switch SW1 maintains the on state.

At time t24, the voltage VOUT becomes higher than the voltage VREF3, and the switch SW1 changes from the on state to the off state. After time t24, switch SW1 maintains the off state. Since the switch SW1 is turned off, the power consumed by the pull-down circuit 3b decreases. Specifically, the power consumed by the resistor R1 is no longer consumed. It should be noted that the period from time t23 to time t24 is the time required for the voltage VOUT to rise from 0V to ½ of the voltage VLD, which is the final voltage, and is therefore 30 μsec or longer.

At time t25, the voltage VOUT reaches the voltage VLD, and the voltage VOUT stops rising. After time t25, the voltage VOUT is maintained at the voltage VLD.

<2-3> Advantages

The semiconductor device 1b of the second embodiment described above is advantageous in that power consumption can be suppressed while simultaneously suppressing malfunctions due to noise, as in the semiconductor device 1 of the first embodiment. Detailed advantages of the semiconductor device 1b of the second embodiment will be described below.

In the semiconductor device 1b of the second embodiment, the slew rate of the output voltage of the output circuit 2a is controlled, as in the semiconductor device 1 of the first embodiment. Therefore, even if the voltage at the node N1 rises instantaneously due to noise, the pull-down circuit 3b maintains the pulled-down state of the node N1. Further, when an H level control signal is applied to the node N1 and the output circuit 2a causes the voltage at the node N2 to be higher than the threshold voltage, the pull-down circuit 3b turns off the switch SW1, and the pull-down circuit 3b sets the node N1 to a non-pull-down state. Therefore, the semiconductor device 1b of the second embodiment enables suppression of the power consumption while simultaneously suppressing malfunctions due to noise.

Further, like the semiconductor device 1 of the first embodiment, the semiconductor device 1b of the second embodiment does not decouple the pull-down circuit 3b until the output of the output circuit 2a actually exceeds the threshold value after the control signal becomes an H level. In other words, the pull-down circuit 3b monitors the output of the output circuit 2a, thereby causing a standby time. This allows the standby time to be set in accordance with the operation timing of the circuit.

<3> Third Embodiment

The configuration of the semiconductor device of the third embodiment differs from that of the semiconductor device of the first embodiment in that the output circuit 2 is replaced with an output circuit 2b, and the pull-down circuit 3 is replaced with a pull-down circuit 3c. A description will be given of the points in which the semiconductor device 1c of the third embodiment differs from the semiconductor device of the first embodiment.

<3-1> Configuration

FIG. 7 is a block diagram showing an example of the configuration of the semiconductor device 1c of the third embodiment. In the semiconductor device 1c of the third embodiment, the output circuit 2 of the semiconductor device 1 described in connection with the first embodiment is replaced with an output circuit 2b, and the pull-down circuit 3 is replaced with a pull-down circuit 3c.

The semiconductor device 1c of the third embodiment is a logic IC that outputs a clock signal.

The output circuit 2b is a circuit that enables the semiconductor device 1c to function as a logic IC. The voltage VDD, which is a power supply voltage, and the ground voltage GND are applied to the output circuit 2b. The output circuit 2b is coupled to nodes N1 and N2. In accordance with the logic level of the node N1, the output circuit 2b switches between an on state (second state) in which the signal CLK, a clock signal, is output to the node N2 and an off state (first state) in which the signal CLK is not output to the node N2. Specifically, the output circuit 2b is turned off when the logic level of the node N1 is at the L level, and is turned on when the logic level of the node N1 is at the H level.

The pull-down circuit 3c pulls down the node N1. Based on the signal applied to the node N2, the pull-down circuit 3c switches between an on state in which the node N1 is pulled down and an off state in which the node N1 is not pulled down. The pull-down circuit 3c includes a resistor R1, a switch SW1, and a control circuit 4c. The resistor R1 and the switch SW1 are coupled in series. For example, one end of the resistor R1 is coupled to the node N1, the other end of the resistor R1 is coupled to one end of the switch SW1, and the other end of the switch SW1 is grounded. In other words, one end of the switch SW1 is coupled to the node N1 via the resistor R1, and the ground voltage GND is applied to the other end of the switch SW1. The control circuit 4c receives a signal CLK applied to the node N2, and counts toggles of the signal CLK. The control circuit 4c turns off the switch SW1 if the toggle count value exceeds a preset determination number of times, for example, 10 times. It should be noted that the count value is reset at regular intervals. The control circuit 4c turns on the switch SW1 if the toggle count value does not exceed the preset determination number of times until it is reset at the end of a cycle.

<3-2> Operation

A description will be given of the operation performed by the semiconductor device 1c of the third embodiment. FIG. 8 is a timing chart showing an operation example of the semiconductor device 1c of the third embodiment. FIG. 8 shows how the semiconductor device 1c operates when noise is applied to the terminal TEN, and how the semiconductor device 1c switches when an H level signal is applied to the terminal TEN.

In FIG. 8, the timing chart starts when a high impedance state is established from a state where the preceding stage device applies an L level to the terminal TEN. In this state, the voltage VEN is 0V, the voltage VOUT is 0V, and the switch SW1 is in the on state. Since the switch SW1 is in the on state, the node N1 is pulled down to 0V by the pull-down circuit 3c.

Since the voltage at the node N1 is 0V, that is, the L level, the output circuit 2b is in an off state, and the voltage VOUT is 0V.

At time t31, noise is applied to the terminal TEN, and the voltage VEN rises rapidly. For example, the peak of the voltage VEN exceeds ½ of the voltage VDD. Thereafter, the voltage VEN decreases, and becomes 0V at time t32. The period from time t31 to time t32 is, for example, several μsec. The period from time t31 to time t32 is shorter than the time required for the control circuit 4c to count toggles of the signal CLK from 0 times to the determination number of times. Therefore, the switch SW1 maintains the on state during the period from time t31 to time t32. In the period from time t31 to time t32, the output circuit 2b may output, for example, a signal CLK corresponding to two toggles, in response to noise, but in the example shown in FIG. 8, output of 0V is maintained.

During the period from time t32 to time t33, there is no change in the situation, so that the voltage VEN is maintained at 0V, the voltage VOUT is maintained at 0V, and the switch SW1 is maintained in the on state.

At time t33, the preceding stage device coupled to the terminal TEN outputs the voltage VDD as an H level signal, and the voltage VEN becomes equal to the voltage VDD. After time t33, the voltage VEN is maintained at the voltage VDD. Since the voltage VEN has become higher than ½ of the voltage VDD, the output circuit 2b starts the operation of outputting the signal CLK at time t33. It should be noted that at time t33, the control circuit 4c has not yet counted the toggles of the clock signal, so that the switch SW1 maintains the on state.

At time t34, the number of toggles of the signal CLK counted by the control circuit 4c exceeds the determination number of times, so that the switch SW1 changes from the on state to the off state. Since the switch SW1 is turned off, the power consumed by the pull-down circuit 3c decreases. Specifically, the power consumed by the resistor R1 is no longer consumed. Since the output circuit 2b continues to output the signal CLK after time t34, the count value of the control circuit 4c exceeds the determination number of times, and the switch SW1 is maintained in the off state.

<3-3> Advantages

The semiconductor device 1c of the third embodiment described above is advantageous in that power consumption can be suppressed while simultaneously suppressing malfunctions due to noise, as in the semiconductor device 1 of the first embodiment. Detailed advantages of the semiconductor device 1c of the third embodiment will be described below.

The semiconductor device 1c of the third embodiment includes a control circuit 4c that counts toggles of a clock signal. The semiconductor device 1c of the third embodiment waits until the toggle count value exceeds the determination number of times after the control signal becomes the H level and the output circuit 2b outputs the signal CLK, and then decouples the pull-down circuit 3c. In other words, the pull-down circuit 3c monitors the output of the output circuit 2b, thereby causing a standby time. By appropriately setting the determination number of times, the standby time can be set in accordance with the operation timing of the circuit.

Because of this standby time, the semiconductor device 1c of the third embodiment maintains the coupled state of the pull-down circuit 3c even if the voltage increases instantaneously due to noise. On the other hand, if the control signal is applied and the output circuit 2b continues to operate for a longer time after the count value exceeds the determination number of times, the pull-down circuit 3c is decoupled. Therefore, the semiconductor device 1c of the third embodiment enables suppression of the power consumption while simultaneously suppressing malfunctions due to noise.

<3-4> Modification

Figure 9:
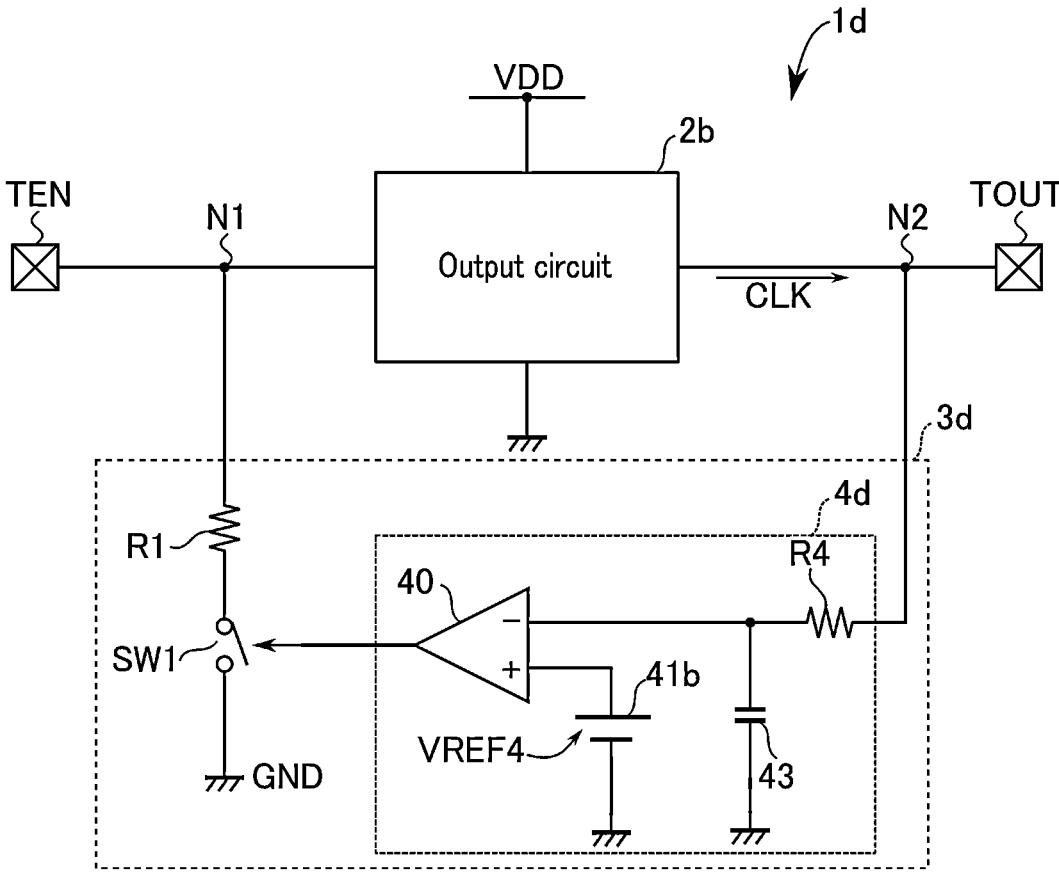
FIG. 9 is a block diagram showing a specific example of the configuration of a semiconductor device according to a first modification of the third embodiment.

In connection with the third embodiment, reference was made to an example in which the control circuit 4c of the pull-down circuit 3c counts toggles of the clock signal. The configuration of the control circuit 4c is not limited to this. For example, the control circuit 4c may determine whether or not the clock signal is present, by processing the clock signal with a low-pass filter and determining the processed signal by means of a comparator. FIG. 9 is a block diagram showing a specific example of the configuration of a semiconductor device according to the first modification of the third embodiment. The semiconductor device 1d of the first modification of the third embodiment differs from the semiconductor device 1c of the third embodiment in that the pull-down circuit 3c is replaced with a pull-down circuit 3d including a control circuit 4d in place of the control circuit 4c.

The pull-down circuit 3d includes a resistor R1, a switch SW1, and a control circuit 4d. One end of the resistor R1 is coupled to the node N1. The other end of the resistor R1 is coupled to one end of the switch SW1. The other end of the switch SW1 is grounded. The control circuit 4d includes a comparator 40, a voltage source 41b, a resistor R4, and a capacitor 43. One end of the resistor R4 is coupled to the node N2. The other end of the resistor R4 is coupled to one electrode of the capacitor 43 and the inverting input terminal of the comparator 40. The other electrode of the capacitor 43 is grounded. The positive output terminal of the voltage source 41b is coupled to a non-inverting input terminal of the comparator 40. The negative output terminal of the voltage source 41b is grounded. The voltage source 41b outputs a voltage VREF4. The voltage VREF4 is lower than the voltage VDD and higher than the ground voltage GND. For example, the voltage VREF4 is lower than ½ of the voltage VDD. The output terminal of the comparator 40 is coupled to the switch SW1. The switch SW1 is turned on when the output of the comparator 40 is at the H level, and turned off when the output of the comparator 40 is at the L level.

The resistor R4 and the capacitor 43 jointly constitute a low-pass filter. The input terminal of this low-pass filter is one end of the resistor R4, and the output terminal thereof is the other end of the resistor R4 and one electrode of the capacitor 43. When the signal CLK output from the output circuit 2c passes through this filter, it is converted into a DC voltage with a height that is approximately ½ of the amplitude of the signal CLK. This DC voltage and the voltage VREF4 are compared by the comparator 40, so that it can be determined whether the signal CLK is being output.

Even in a case where the pull-down circuit 3d is configured in this manner, advantages similar to those of the semiconductor device 1c of the third embodiment can be obtained.

<4> Fourth Embodiment

The configuration of the semiconductor device of the fourth embodiment differs from that of the semiconductor device of the first embodiment in that the output circuit 2 is replaced with an output circuit 2c, and the pull-down circuit 3 is replaced with a pull-up circuit 5. A description will be given of the points in which the semiconductor device 1e of the fourth embodiment differs from the semiconductor device of the first embodiment.

<4-1> Configuration

FIG. 10 is a block diagram showing an example of the configuration of a semiconductor device 1e of the fourth embodiment. In the semiconductor device 1e of the fourth embodiment, the output circuit 2 of the semiconductor device 1 described in connection with the first embodiment is replaced with an output circuit 2c, and the pull-down circuit 3 is replaced with a pull-up circuit 5.

The semiconductor device 1e of the fourth embodiment is a load switch that has a slew rate control function and supplies power to a load.

The semiconductor device 1e includes terminals TEN and TOUT, an output circuit 2c, and a pull-up circuit 5. The terminal TEN is a control signal input terminal of the semiconductor device 1e. The terminal TEN is coupled to a node N1. A control signal is applied to the terminal TEN from a preceding stage circuit (not shown) provided externally of the semiconductor device 1e. The terminal TOUT is an output terminal of the semiconductor device 1e. Power is supplied to an external device of the semiconductor device 1e from the terminal TOUT. The terminal TOUT is coupled to a node N2.

The output circuit 2c is a circuit that enables the semiconductor device 1e to function as a load switch. The voltage VDD, which is a power supply voltage, and the ground voltage GND are applied to the output circuit 2c. The output circuit 2c is coupled to the nodes N1 and N2. In accordance with the logic level of the node N1, the output circuit 2c switches between an on state (second state) in which the voltage VDD is output to the node N2 and an off state (first state) in which the voltage VDD is not output to the node N2. Specifically, the output circuit 2c is turned on when the logic level of the node N1 is at the L level, and is turned off when the logic level of the node N1 is at the H level. The output circuit 2c has a slew rate control function. That is, when the off state is switched to the on state, the output circuit 2c controls the voltage increase rate at which the output voltage is switched from 0V (the state where no voltage is output) to the voltage VDD. More specifically, the output circuit 2c is configured, for example, such that 30 µsec or a longer time is required for switching from 0V to ½ of the final voltage, that is, from 0V to ½ of the voltage VDD.

The pull-up circuit 5 pulls up the node N1. Specifically, based on the voltage at the node N2, the pull-up circuit 5 switches between an on state in which the node N1 is pulled up and an off state in which the node N1 is not pulled up. The pull-up circuit 5 includes a resistor R5, a switch SW2, and a control circuit 6. The resistor R5 and the switch SW2 are coupled in series. In the example shown in FIG. 10, one end of the resistor R5 is coupled to the node N1, the other end of the resistor R5 is coupled to one end of the switch SW2, and the other end of the switch SW2 is applied with the voltage VDD. In other words, one end of the switch SW2 is coupled to the node N1 via the resistor R5, and the voltage VDD, which is the power supply voltage, is applied to the other end of the switch SW2. The control circuit 6 controls the switch SW2, based on the voltage at the node N2. Specifically, in a case where the output circuit 2c is detected as outputting a voltage equal to or higher than a preset threshold to the node N2, the control circuit 6 turns off the switch SW2. In a case where the output circuit 2c is detected as not outputting a voltage equal to or higher than the threshold value to the node N2, the control circuit 6 turns on the switch SW2.

FIG. 11 is a block diagram showing a specific example of the configuration of the output circuit 2c and the control circuit 6 according to the fourth embodiment. As shown in FIG. 11, the output circuit 2c of the fourth embodiment differs from the output circuit 2 of the first embodiment in that the non-inverting logic circuit 20 is replaced with an inverting logic circuit 20a. The voltage VDD and the ground voltage GND are applied to the inverting logic circuit 20a. A signal input terminal of the inverting logic circuit 20a is coupled to the node N1, and the signal output terminal is coupled to the gates of the transistors MP1 and MN1. The inverting logic circuit 20a detects the logic level of the node N1, inverts the detected logic level, and applies a voltage based on the inverted logic level to the gates of the transistors MP1 and MN1. For example, in a case where an H level voltage is applied to the node N1, the inverting logic circuit 20a outputs an L level voltage. For example, in a case where an L level voltage is applied to the node N1, the inverting logic circuit 20a outputs an H level voltage. The other configurations of the output circuit 2c are similar to the configurations of the output circuit 2 of the first embodiment.

With reference to FIG. 11, a further description will be given of the configuration of the control circuit 6 included in the pull-up circuit 5. As shown in FIG. 11, the control circuit 6 of the fourth embodiment includes a comparator 60 and a voltage source 61. The voltage source 61 outputs a voltage VREF5. The voltage VREF5 is higher than the ground voltage GND and lower than the voltage VDD. The voltage VREF5 is, for example, ½ of the voltage VDD. The positive output terminal of the voltage source 61 is coupled to the non-inverting input terminal of the comparator 60. The negative output terminal of the voltage source 61 is grounded.

The inverting input terminal of the comparator 60 is coupled to the node N2. The output terminal of the comparator 60 is coupled to the switch SW2. The switch SW2 is controlled based on the output of the comparator 60. More specifically, in a case where the output of the comparator 60 is at the H level, the switch SW2 is turned on. In a case where the output of the comparator 60 is at the L level, the switch SW2 is turned off.

<4-2> Operation

A description will be given of the operation performed by the semiconductor device 1e of the fourth embodiment. FIG. 12 is a timing chart showing an operation example of the semiconductor device 1e of the fourth embodiment. FIG. 12 shows how the semiconductor device 1e operates when noise is applied to the terminal TEN, and how the semiconductor device 1e switches when an H level signal is applied to the terminal TEN. In FIG. 12, the states of the voltage VEN, the voltage VOUT and the switch SW2 are shown in order from the top.

In FIG. 12, the timing chart starts when a high impedance state is established from a state where the preceding stage device applies an H level to the terminal TEN. In this state, the voltage VEN is the voltage VDD, the voltage VOUT is 0V, and the switch SW2 is in the on state. Since the switch SW2 is in the on state, the node N1 is pulled up to the voltage VDD by the pull-up circuit 5. Since the voltage at the node N1 is the VDD, that is, the H level, the output circuit 2c is in an off state, and the voltage VOUT is 0V.

At time t41, noise is applied to the terminal TEN, and the voltage VEN drops rapidly. For example, the peak of the drop of the voltage VEN is lower than ½ of the voltage VDD. Thereafter, the voltage VEN rises, and becomes the voltage VDD at time t42. The period from time t41 to time t42 is, for example, several µsec. The period from time t41 to time t42 is shorter than the time required for the output of the output circuit 2c to switch from 0V to the voltage VDD. Therefore, the output circuit 2c maintains output of 0V.

Since the voltage VOUT is maintained at 0V, the switch SW2 also maintains an on state during the period from time t41 to time t42.

During the period from time t42 to time t43, there is no change in the situation, so that the voltage VEN is maintained at the voltage VDD, the voltage VOUT is maintained at 0V, and the switch SW2 is maintained in the on state.

At time t43, the preceding stage device coupled to the terminal TEN outputs 0V as an L level signal, and the voltage VEN becomes 0V. After time t43, the voltage VEN is maintained at 0V. Since the voltage VEN has become lower than ½ of the voltage VDD, the output circuit 2c starts the operation of outputting the voltage VDD at time t43. During the period from time t43 to time t45, the voltage VOUT rises from 0V to the voltage VDD, with the slew rate being controlled by the output circuit 2c. It should be noted that at time t43, the voltage VOUT is lower than the voltage VREF5, so that the switch SW2 maintains the on state.

At time t44, the voltage VOUT becomes higher than the voltage VREF5, and the switch SW2 changes from the on state to the off state. After time t44, the switch SW2 maintains the off state. Since the switch SW2 is turned off, the power consumed by the pull-up circuit 5 decreases. Specifically, the power consumed by the resistor R5 is no longer consumed. It should be noted that the period from time t43 to time t44 is the time required for the voltage VOUT to rise from 0V to ½ of the voltage VDD, which is the final voltage, and is therefore 30 μsec or longer.

At time t45, the voltage VOUT reaches the voltage VDD, and the voltage VOUT stops rising. After time t45, the voltage VOUT is maintained at the voltage VDD.

<4-3> Advantages

The semiconductor device 1e of the fourth embodiment described above is advantageous in that power consumption can be suppressed while simultaneously suppressing malfunctions due to noise, as in the semiconductor device 1 of the first embodiment. Detailed advantages of the semiconductor device 1e of the fourth embodiment will be described below.

In the semiconductor device 1e of the fourth embodiment, the slew rate of the output voltage of the output circuit 2c is controlled, as in the semiconductor device 1 of the first embodiment. Therefore, even if the voltage at the node N1 drops instantaneously due to noise, the pull-up circuit 5 maintains the pulled-up state of the node N1. Further, when an L-level control signal is applied to the node N1 and the output circuit 2c causes the voltage at the node N2 to be higher than the threshold voltage, the pull-up circuit 5 turns off the switch SW2, and the pull-up circuit 5 sets the node N1 to a non-pull-up state. Therefore, the semiconductor device 1e of the fourth embodiment enables suppression of the power consumption while simultaneously suppressing malfunctions due to noise.

Further, like the semiconductor device 1 of the first embodiment, the semiconductor device 1e of the fourth embodiment does not decouple the pull-up circuit 5 until the output of the output circuit 2c actually exceeds the threshold value after the control signal becomes an L level. In other words, the pull-up circuit 5 monitors the output of the output circuit 2c, thereby causing a standby time. This allows the standby time to be set in accordance with the operation timing of the circuit.

<5> Modifications Etc.

In the above embodiments and modifications, reference was made to an example in which the pull-down circuit and the pull-up circuit include resistors. The pull-down circuit and the pull-up circuit are not limited to these. The pull-down and pull-up circuits may include current sources in place of the resistors.

FIG. 13 is a block diagram illustrating an example of the configuration of a semiconductor device according to the second modification of the first embodiment. The semiconductor device 1f of the second modification of the first embodiment differs from the semiconductor device 1 of the first embodiment in that the pull-down circuit 3 is replaced with a pull-down circuit 3e.

The pull-down circuit 3e of the second modification of the first embodiment differs from the pull-down circuit 3 of the first embodiment in that the resistor R1 is replaced with a current source CS6. The current source CS6 is coupled to the node N1. The current source CS6 is coupled to one end of the switch SW1. The current source CS6 is configured to flow a current from the node N1 toward one end of the switch SW1. The other configurations are similar to the configurations of the pull-down circuit 3 of the first embodiment.

In this manner, even if the current source is used instead of the resistor, the pull-down circuit 3e of the second modification of the first embodiment functions in a manner similar to that of the pull-down circuit 3 of the first embodiment.

FIG. 14 is a block diagram illustrating an example of the configuration of a semiconductor device according to a first modification of the fourth embodiment. The semiconductor device 1g of the first modification of the fourth embodiment differs from the semiconductor device 1e of the fourth embodiment in that the pull-up circuit 5 is replaced with a pull-up circuit 5a.

The pull-up circuit 5a according to the first modification of the fourth embodiment differs from the pull-up circuit 5 of the fourth embodiment in that the resistor R5 is replaced with a current source CS7. The current source CS7 is coupled to the node N1. The current source CS7 is coupled to one end of the switch SW2. The current source CS7 is configured to flow a current from one end of the switch SW2 toward the node N1. The other configurations are similar to the configurations of the pull-up circuit 5 of the fourth embodiment.

In this manner, even if the current source is used in place of the resistor, the pull-up circuit 5a according to the first modification of the fourth embodiment functions in a manner similar to that of the pull-up circuit 5 of the fourth embodiment.

In the above embodiments, reference was made to an example in which the pull-down circuit includes a switch. In the first modification of the first embodiment, reference was made to an example in which one N-channel transistor is used as a specific example of the switch. The configuration of the pull-down circuit is not limited to this. For example, the switch SW1 of the pull-down circuit may be configured by combining an N-channel type transistor and a P-channel type transistor.

FIG. 15 is a block diagram illustrating an example of the configuration of a semiconductor device according to a third modification of the first embodiment. The semiconductor device 1h of the third modification of the first embodiment differs from the semiconductor device 1 of the first embodiment in that the pull-down circuit 3 is replaced with a pull-down circuit 3f.

The pull-down circuit 3f of the third modification of the first embodiment includes a resistor R1, transistors MN9 and MP10, an inverter INV1, and a control circuit 4e. The transistor MN9 is an N-channel transistor. The transistor MP10 is a P-channel transistor. One end of the resistor R1 is coupled to the node N1. The other end of the resistor R1, the drain of the transistor MN9, and the source of the transistor MP10 are coupled to each other. The source of the transistor MN9 and the drain of the transistor MP10 are grounded. The gate of the transistor MN9 and the input terminal of the inverter INV1 are coupled to each other.

The output terminal of the inverter INV1 is coupled to the gate of the transistor MP10. The input terminal of the control circuit 4e is coupled to the node N2. The output terminal of the control circuit 4e is coupled to the gate of the transistor MN9 and the input terminal of the inverter INV1. The control circuit 4e controls the voltage applied to the gate of the transistor MN9 and the input terminal of the inverter INV1, based on the voltage at the node N2. Specifically, in a case where the output circuit 2 is detected as outputting a voltage equal to or higher than a preset threshold to the node N2, the control circuit 4e sets the voltages at the gate of the transistor MN9 and the input terminal of the inverter INV1 to the L level. In a case where the output circuit 2 is detected as not outputting a voltage equal to or higher than the threshold value to the node N2, the control circuit 4e sets the voltages at the gate of the transistor MN9 and the input terminal of the inverter INV1 to the H level.

In this manner, even in a case where the N-channel transistor MN9 and the P-channel transistor MP10 are used in combination as the switch SW1, the pull-down circuit 3f of the third modification of the first embodiment functions in a manner similar to that of the pull-down circuit 3 of the first embodiment.

In the above embodiment, reference was made to an example in which the pull-up circuit includes a switch. The pull-up circuit is not limited to this. For example, the switch SW2 of the pull-up circuit may be configured using a P-channel transistor, or may be configured using an N-channel transistor and a P-channel transistor in combination.

FIG. 16 is a block diagram illustrating an example of the configuration of a semiconductor device according to a second modification of the fourth embodiment. The semiconductor device 1i of the second modification of the fourth embodiment differs from the semiconductor device 1e of the fourth embodiment in that the pull-up circuit 5 is replaced with a pull-up circuit 5b.

The pull-up circuit 5b of the second modification of the fourth embodiment includes a resistor R5, a transistor MP11, and a control circuit 6a. The transistor MP11 is a P-channel type transistor. One end of the resistor R5 is coupled to the node N1. The other end of the resistor R5 and the drain of the transistor MP11 are coupled to each other. The voltage VDD is applied to the source of the transistor MP11. The input terminal of the control circuit 6a is coupled to the node N2. The output terminal of the control circuit 6a is coupled to the gate of the transistor MP11. The control circuit 6a controls the voltage applied to the gate of transistor MP11, based on the voltage at the node N2. Specifically, in a case where the output circuit 2c is detected as outputting a voltage equal to or higher than a preset threshold to the node N2, the control circuit 6a sets the voltage at the gate of the transistor MP11 to the H level. In a case where the output circuit 2c is detected as not outputting a voltage equal to or higher than the threshold value to the node N2, the control circuit 6a sets the voltage at the gate of the transistor MP11 to the L level.

In this manner, even if the P-channel transistor MP11 is used as the switch SW2, the pull-up circuit 5b of the second modification of the fourth embodiment functions in a manner similar to that of the pull-up circuit 5 of the fourth embodiment.

FIG. 17 is a block diagram illustrating an example of the configuration of a semiconductor device according to a third modification of the fourth embodiment. The semiconductor device 1j of the third modification of the fourth embodiment differs from the semiconductor device 1e of the fourth embodiment in that the pull-up circuit 5 is replaced with a pull-up circuit 5c.

The pull-up circuit 5c of the third modification of the fourth embodiment includes a resistor R5, transistors MN10 and MP12, an inverter INV2, and a control circuit 6b. The transistor MN10 is an N-channel transistor. The transistor MP12 is a P-channel type transistor. One end of the resistor R5 is coupled to the node N1. The other end of the resistor R5, the source of the transistor MN10, and the drain of the transistor MP12 are coupled to each other. The drain of the transistor MN10 and the source of the transistor MP12 are applied with the voltage VDD. The gate of the transistor MN10 and the input terminal of the inverter INV2 are coupled to each other. The output terminal of the inverter INV2 and the gate of the transistor MP12 are coupled to each other. The input terminal of the control circuit 6b is coupled to the node N2. The output terminal of the control circuit 6b is coupled to the gate of the transistor MN10 and the input terminal of the inverter INV2. The control circuit 6b controls the voltage applied to the gate of the transistor MN10 and the input terminal of the inverter INV2, based on the voltage at the node N2. Specifically, in a case where the output circuit 2c is detected as outputting a voltage equal to or higher than a preset threshold to the node N2, the control circuit 6b sets the voltages at the gate of the transistor MN10 and the input terminal of the inverter INV2 to the L level. In a case where the output circuit 2c is detected as not outputting a voltage equal to or higher than the threshold value to the node N2, the control circuit 6b sets the voltages at the gate of the transistor MN10 and the input terminal of the inverter INV2 to the H level.

In this manner, even in a case where the N-channel transistor MN10 and the P-channel transistor MP12 are used in combination as the switch SW2, the pull-up circuit 5c of the third modification of the fourth embodiment functions in a manner similar to that of the pull-up circuit 5 of the fourth embodiment.

In connection with the above embodiments and modifications, reference was made to an example in which the semiconductor device includes a terminal TOUT. The configuration of the semiconductor device is not limited to this. The terminal TOUT does not have to be provided. Specifically, the outputs of the output circuit may be used only inside the semiconductor device.

In the present specification, the term "coupling" means that elements are electrically coupled, and does not exclude the case where another element is interposed in between. In addition, "electrically coupling" may use an insulator as long as the insulator does not affect the proper operation accomplished by the electrical coupling. In the specification, the "on state" indicates that a voltage equal to or higher than the threshold voltage of a transistor is applied to the gate of the transistor. The "off state" indicates that a voltage lower than the threshold voltage of a transistor is applied to the gate of that transistor, and does not exclude the possibility that a small current, such as a leak current of the transistor, flows.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first terminal which is coupled to a first node and to which a control signal is externally input;
a first circuit coupled to the first node, configured to switch based on a logic level of the first node between a first state where a first voltage is not output to a second node and a second state where the first voltage is output to the second node, and configured to control a slew rate of an output voltage at a time of switching from the first state to the second state; and
a second circuit including a switch circuit which includes one end coupled to the first node and another end applied with a second voltage, and configured to control the switch circuit based on a voltage at the second node, wherein
the second voltage is a ground voltage, and
the second circuit is configured to set the switch circuit to a decoupled state in a case where the voltage at the second node is higher than a third voltage, and is configured to set the switch circuit to a coupled state in a case where the voltage at the second node is lower than the third voltage.

2. The semiconductor device according to claim 1, wherein
the second circuit further includes an inverter which includes an input terminal coupled to the second node,
the switch circuit is a first transistor, and
an output terminal of the inverter is coupled to a gate of the first transistor.

3. The semiconductor device according to claim 1, wherein
the first voltage is equal to a power supply voltage applied to the first circuit.

4. The semiconductor device according to claim 1, wherein
the first voltage is lower than a power supply voltage applied to the first circuit.

5. The semiconductor device according to claim 1, wherein
the second circuit further includes a resistor element that is coupled in series to the one end of the switch circuit.

6. The semiconductor device according to claim 1, wherein
the second circuit further includes a current source that is coupled in series to the one end of the switch circuit.

7. A semiconductor device comprising:
a first terminal which is coupled to a first node and to which a control signal is externally input;
a first circuit coupled to the first node, configured to switch based on a logic level of the first node between a first state where a first voltage is not output to a second node and a second state where the first voltage is output to the second node, and configured to control a slew rate of an output voltage at a time of switching from the first state to the second state; and
a second circuit including a switch circuit which includes one end coupled to the first node and another end applied with a second voltage, and configured to control the switch circuit based on a voltage at the second node, wherein
the second voltage is a power supply voltage, and
the second circuit is configured to set the switch circuit to a decoupled state in a case where the voltage at the second node is higher than a third voltage, and is configured to set the switch circuit to a coupled state in a case where the voltage at the second node is lower than the third voltage.

8. The semiconductor device according to claim 7, wherein
the second circuit further includes a current source coupled in series to the one end of the switch circuit.

9. The semiconductor device according to claim 7, wherein the first voltage is equal to a power supply voltage applied to the first circuit.

10. The semiconductor device according to claim 7, wherein the second circuit further includes a resistor element that is coupled in series to the one end of the switch circuit.

11. A semiconductor device comprising:
a first terminal which is coupled to a first node and to which a control signal is externally input;
a first circuit configured to switch based on a logic level of the first node between a first state where a first signal is not output to a second node and a second state where the first signal is output to the second node; and
a second circuit including a switch circuit which includes one end coupled to the first node and another end applied with a second voltage, and configured to control the switch circuit based on the first signal applied to the second node wherein
the second circuit further includes a resistor element that is coupled in series to the one end of the switch circuit.

12. The semiconductor device according to claim 11, wherein
the second circuit is configured to count toggles of the first signal applied to the second node, and is configured to control the switch circuit based on a number of counts.

13. The semiconductor device according to claim 11, wherein
the second circuit further includes a low-pass filter which includes an input end coupled to the second node, and is configured to control the switch circuit based on an output of the low-pass filter.

* * * * *